United States Patent
Surthi et al.

(10) Patent No.: US 12,041,779 B2
(45) Date of Patent: Jul. 16, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: Shyam Surthi, Boise, ID (US); Kunal Shrotri, Boise, ID (US); Matthew Thorum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 332 days.

(21) Appl. No.: 17/678,983

(22) Filed: Feb. 23, 2022

(65) Prior Publication Data
US 2022/0181334 A1  Jun. 9, 2022

Related U.S. Application Data

(62) Division of application No. 16/863,000, filed on Apr. 30, 2020, now Pat. No. 11,296,103.

(51) Int. Cl.
| | | |
|---|---|---|
| H10B 43/27 | (2023.01) | |
| H10B 41/10 | (2023.01) | |
| H10B 41/27 | (2023.01) | |
| H10B 41/35 | (2023.01) | |
| H10B 43/10 | (2023.01) | |
| H10B 43/35 | (2023.01) | |

(52) U.S. Cl.
CPC ............ *H10B 43/35* (2023.02); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC .................... H10B 43/27; H10B 43/20
See application file for complete search history.

(56) References Cited

U.S. PATENT DOCUMENTS

| | | | |
|---|---|---|---|
| 10,038,008 B1 | 7/2018 | Hopkins et al. | |
| 2011/0287612 A1 | 11/2011 | Lee et al. | |
| 2016/0086972 A1* | 3/2016 | Zhang | H10B 43/35 438/269 |
| 2016/0148949 A1 | 5/2016 | Jayanti et al. | |
| 2018/0204849 A1 | 7/2018 | Carlson et al. | |

(Continued)

FOREIGN PATENT DOCUMENTS

| | | |
|---|---|---|
| CN | 110444543 | 11/2019 |
| CN | 202110466213.3 | 8/2023 |

*Primary Examiner* — Christopher A Johnson
(74) *Attorney, Agent, or Firm* — Wells St. John P.S.

(57) ABSTRACT

Some embodiments include an integrated assembly having a vertical stack of alternating insulative and conductive levels. The conductive levels have terminal regions and nonterminal regions. The terminal regions are vertically thicker than the nonterminal regions. Channel material extends vertically through the stack. Tunneling material is adjacent the channel material. Charge-storage material is adjacent the tunneling material. High-k dielectric material is between the charge-storage material and the terminal regions of the conductive levels. The insulative levels have carbon-containing first regions between the terminal regions of neighboring conductive levels, and have second regions between the nonterminal regions of the neighboring conductive levels. Some embodiments include methods of forming integrated assemblies.

18 Claims, 45 Drawing Sheets

(56) References Cited

U.S. PATENT DOCUMENTS

| | | |
|---|---|---|
| 2019/0198510 A1 | 6/2019 | Kim |
| 2019/0348419 A1 | 11/2019 | Tang et al. |
| 2020/0144283 A1 | 5/2020 | Kim et al. |
| 2020/0168624 A1 | 5/2020 | Howder et al. |
| 2021/0057434 A1 | 2/2021 | Surthi et al. |
| 2021/0057437 A1 | 2/2021 | Surthi et al. |
| 2021/0057438 A1 | 2/2021 | Hopkins et al. |
| 2021/0143100 A1 | 5/2021 | Chakravarthi et al. |

* cited by examiner

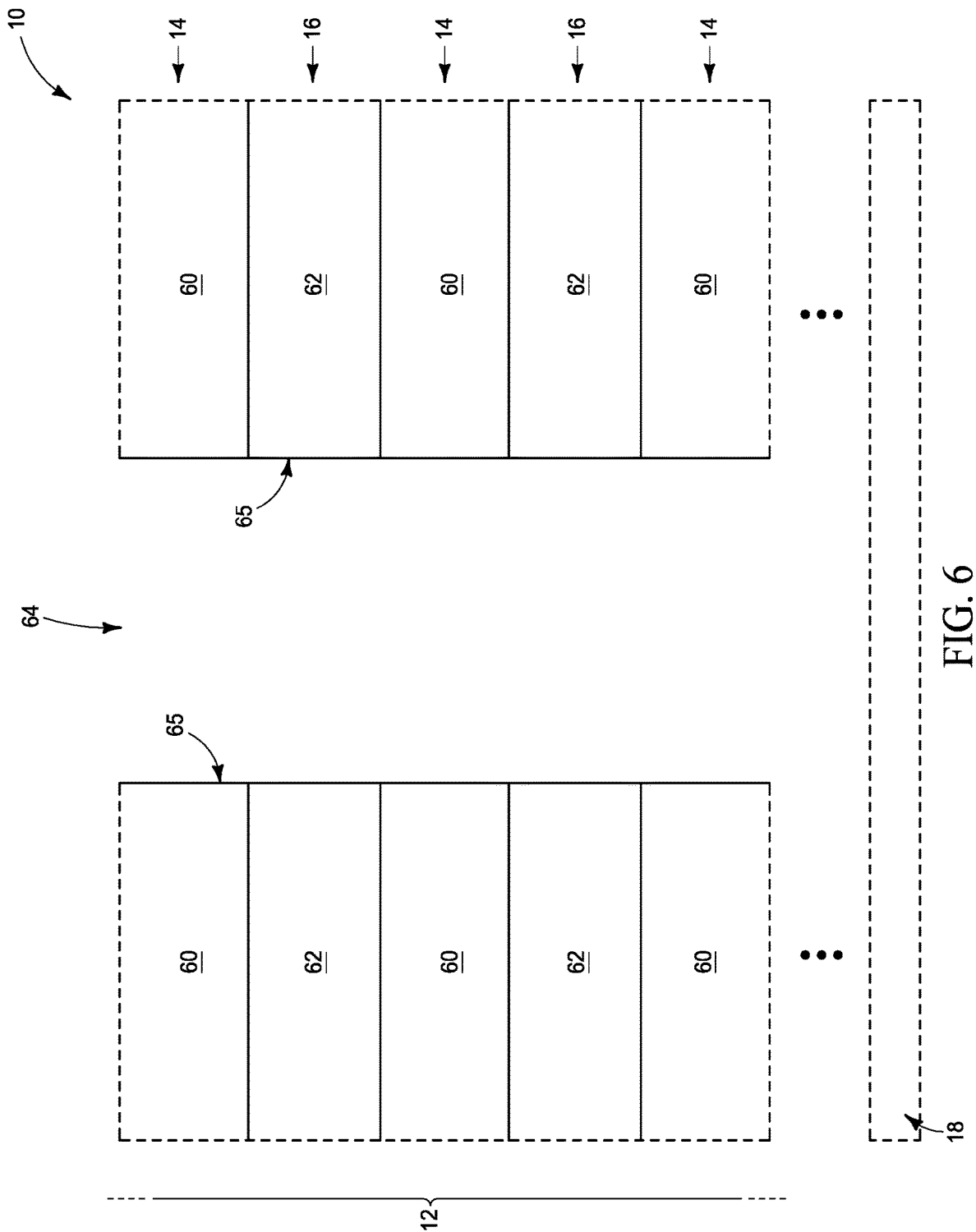

INTEGRATED ASSEMBLIES AND METHODS OF FORMING INTEGRATED ASSEMBLIES

RELATED PATENT DATA

This patent resulted from a divisional of U.S. patent application Ser. No. 16/863,000 filed Apr. 30, 2020 which is hereby incorporated by reference herein.

TECHNICAL FIELD

Integrated assemblies (e.g., integrated NAND memory). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 5 and 6 are diagrammatic cross-sectional side views of a region of an integrated assembly shown at example sequential process stages of an example method for forming an example NAND memory array.

DETAILED DESCRIPTION OF THE ILLUSTRATED EMBODIMENTS

Some embodiments include integrated assemblies having alternating conductive levels and insulative levels; and having carbon-containing material within regions of the insulative levels. Some embodiments include methods of forming integrated assemblies. The methods may utilize etch-stop material (e.g., carbon-containing material, metal-containing material, etc.) to protect dielectric-barrier material during removal of materials adjacent the dielectric material. Alternatively, the methods may omit the etch-stop material, and may instead utilize etch conditions which selective remove one or more materials relative to the dielectric-barrier material.

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may advantageously impede migration of charge between memory cells.

Example embodiments are described with reference to FIGS. 5-40.

Figure 1:
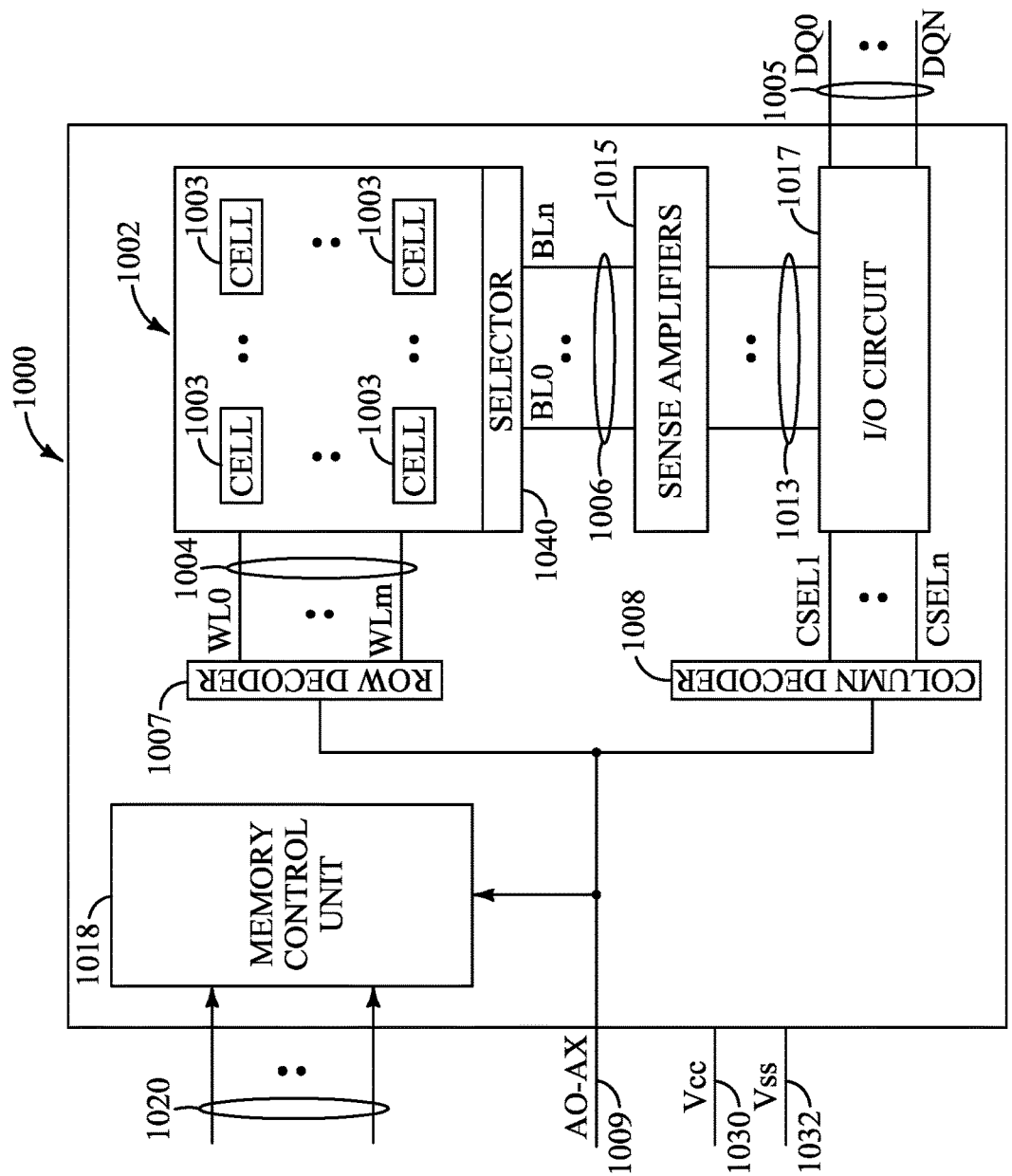
FIG. 1 shows a block diagram of a prior art memory device having a memory array with memory cells.
Figure 2:
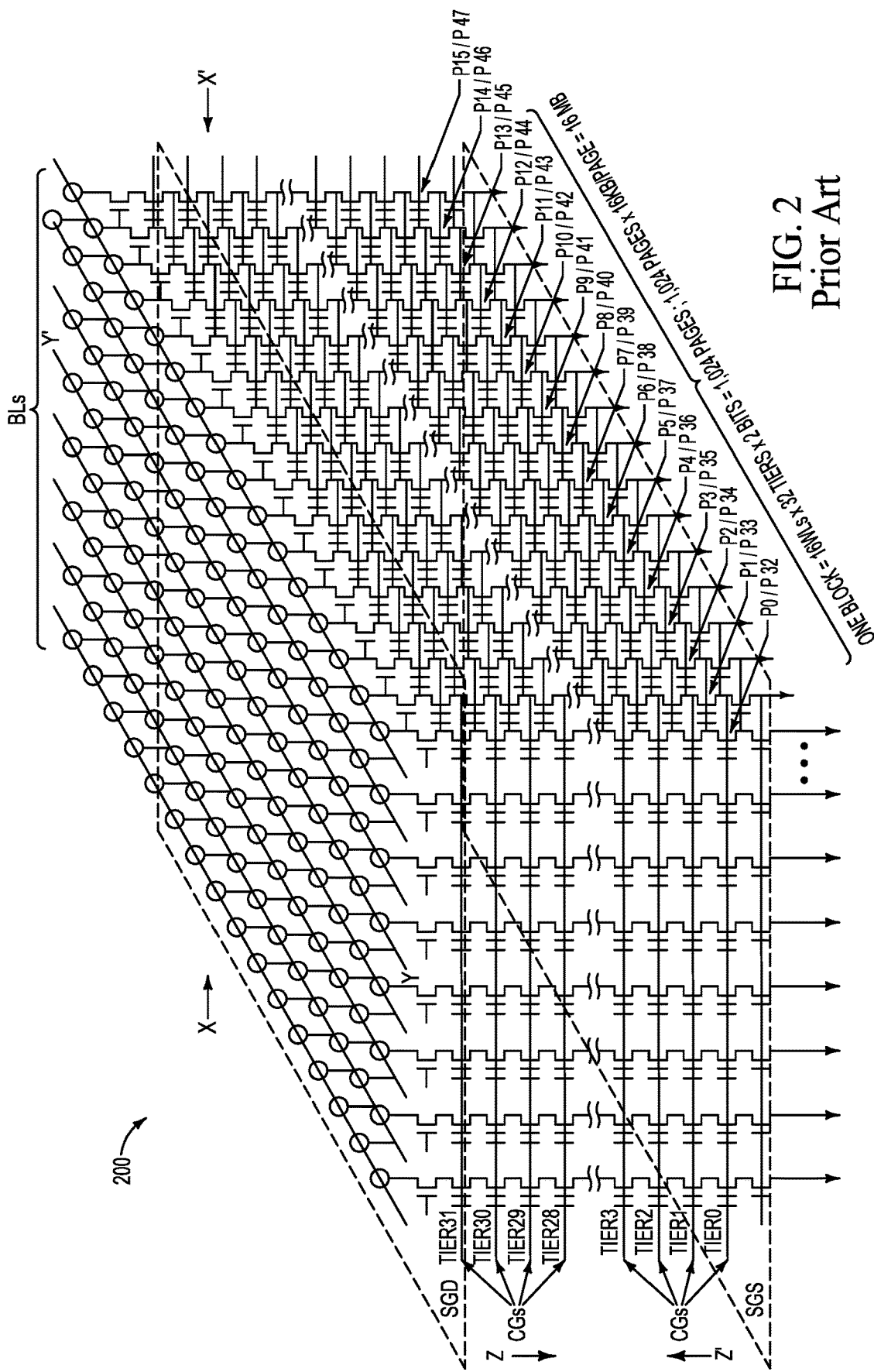
FIG. 2 shows a schematic diagram of the prior art memory array of FIG. 1 in the form of a 3D NAND memory device.
Figure 3:
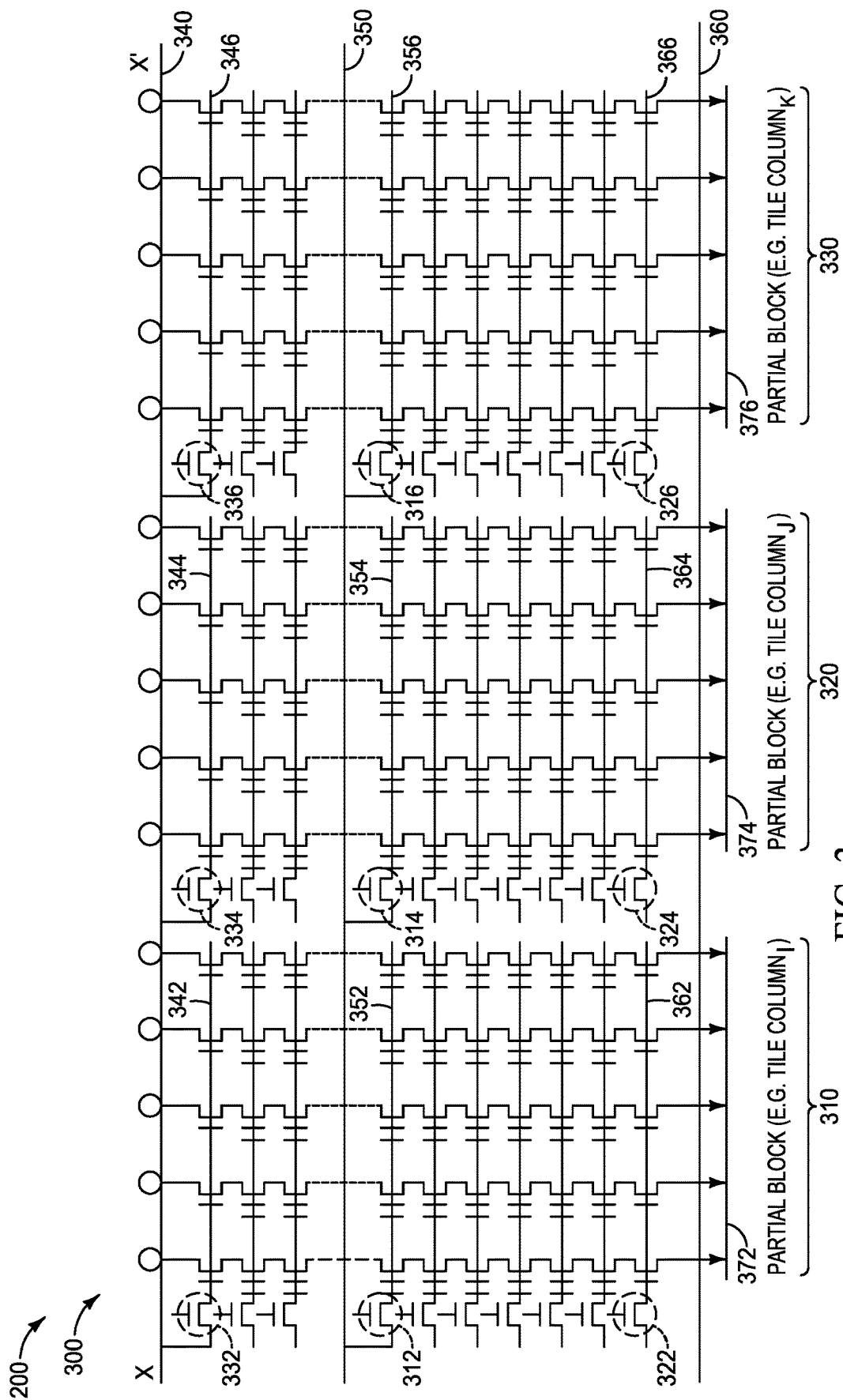
FIG. 3 shows a cross-sectional view of the prior art 3D NAND memory device of FIG. 2 in an X-X' direction.
Figure 4:
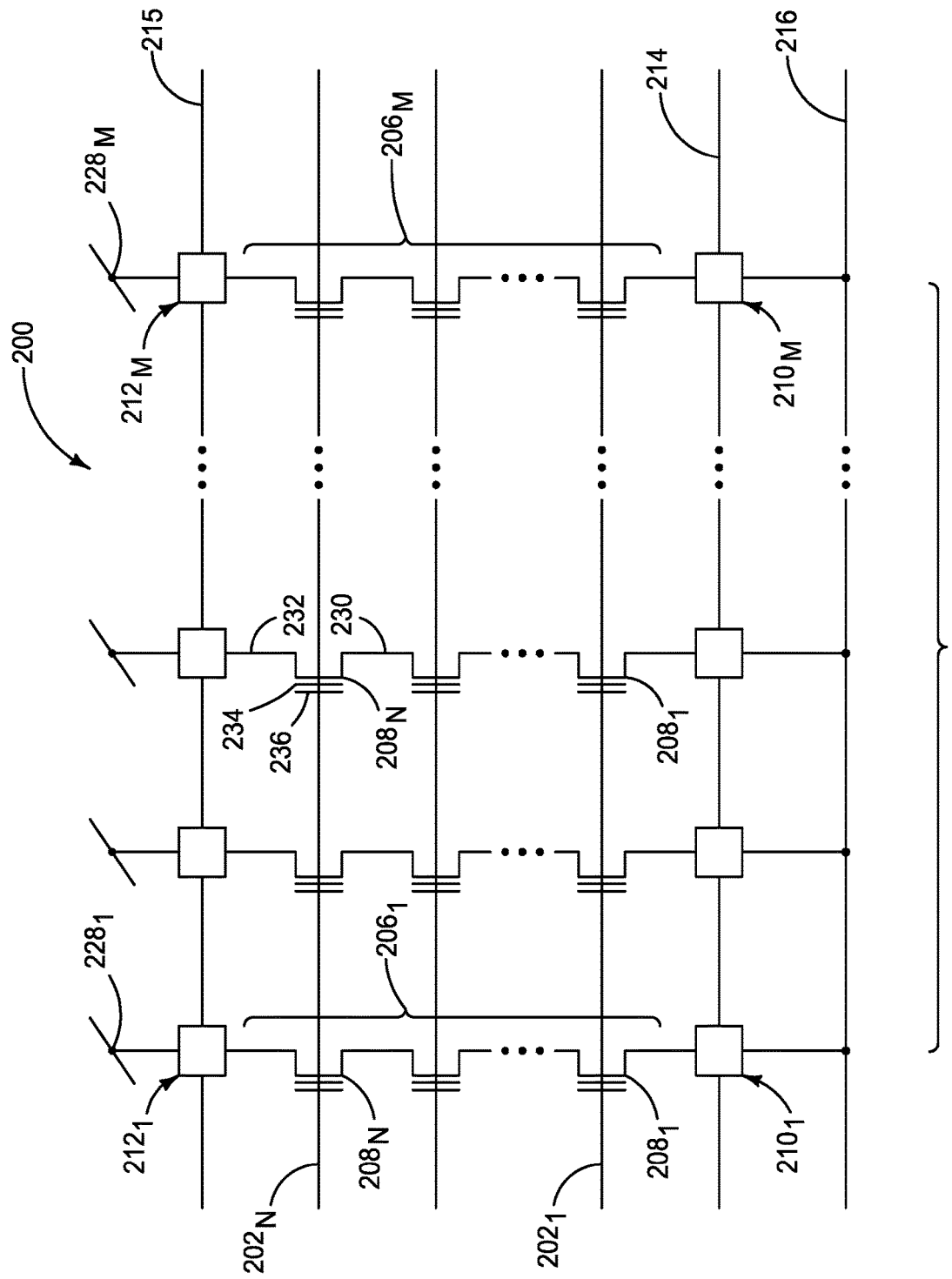
FIG. 4 is a schematic diagram of a prior art NAND memory array.
Figure 5:
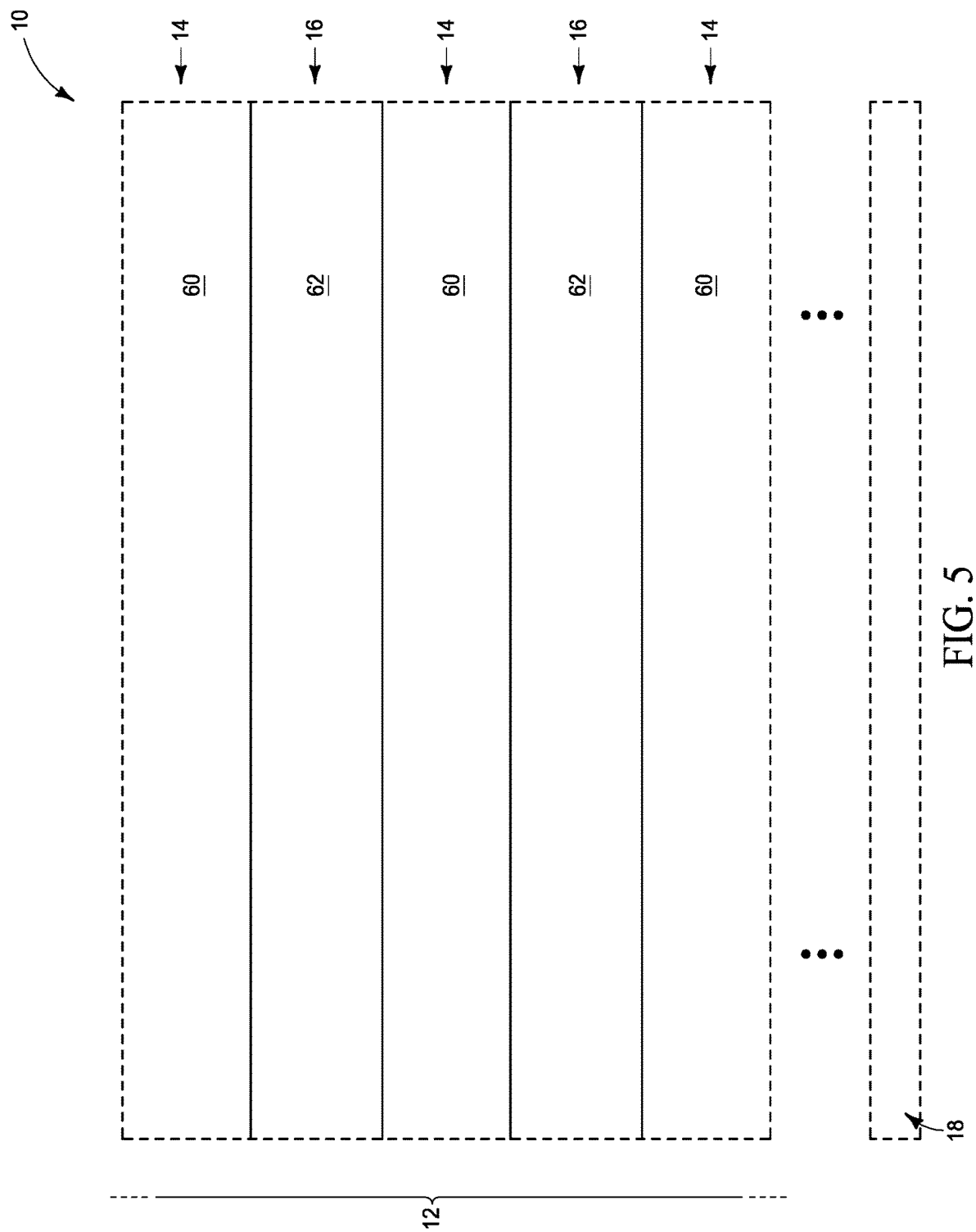

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14/16 may have vertical thicknesses within a range of from about 15 nm to about 40 nm; within a range of from about 15 nm to about 20 nm, etc.

The stack 12 is shown to be supported over a base 18 (i.e., to be formed over the base 18). The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Referring to FIG. 6, an opening 64 is formed to extend through the stack 12. The opening 64 has sidewalls 65 extending along the first and second materials 60 and 62.

Figure 6A:
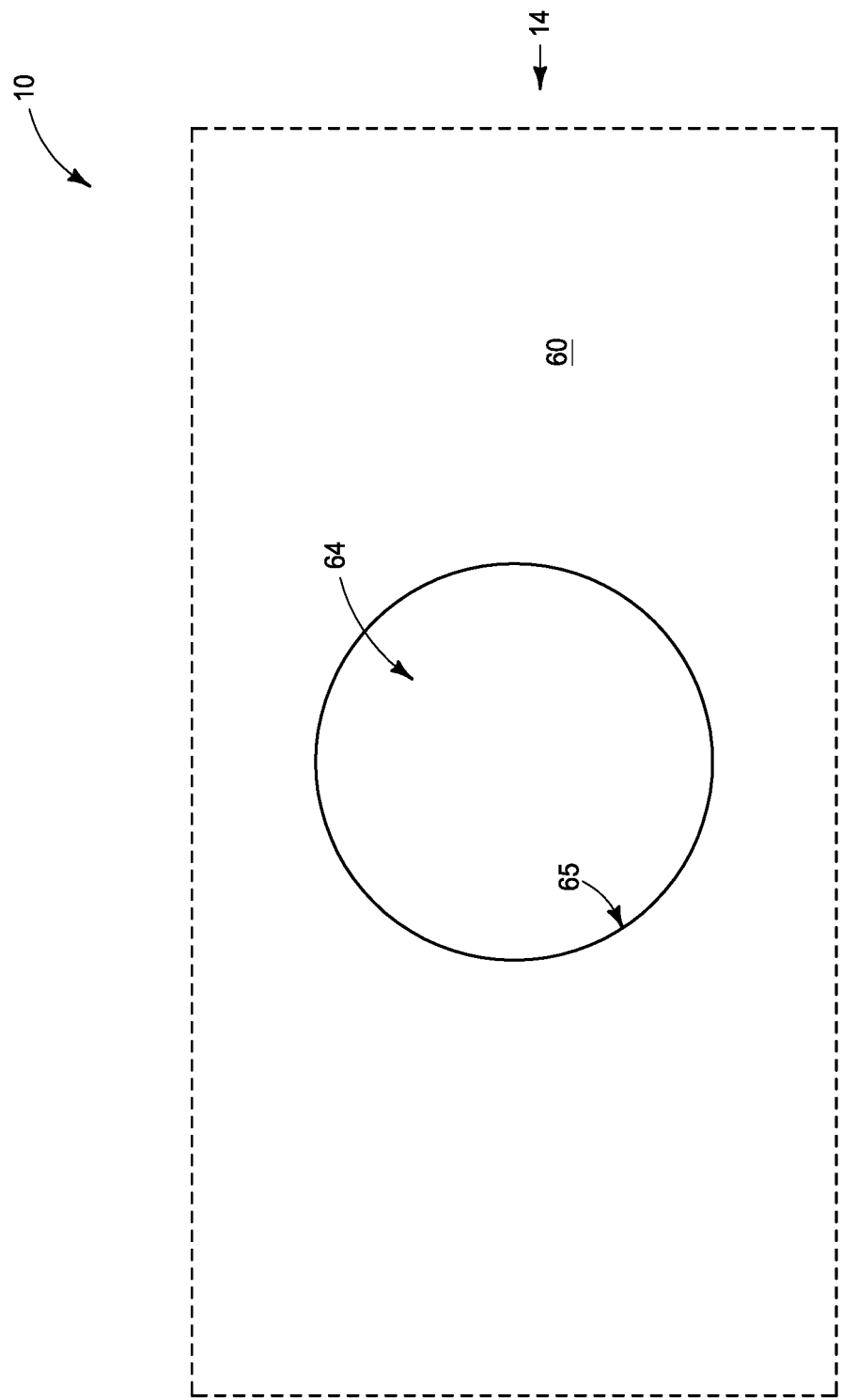
FIG. 6A is a diagrammatic top-down view of a portion of the integrated assembly of FIG. 6.

FIG. 6A is a top-down view through one of the levels 14 of a region of the assembly 10 at the process stage of FIG. 6 and shows that the opening 64 may have a closed shape (circular, elliptical, square or other polygonal, etc.) when viewed from above. In the illustrated embodiment the opening 64 is circular when viewed from above. The sidewalls 65 along the cross-section of FIG. 6 are part of a continuous sidewall 65, as shown by the top view of FIG. 6A. The sidewall 65 may be referred to as a peripheral sidewall of the opening, or as a peripheral sidewall surface of the opening. The terms "peripheral sidewall" and "peripheral sidewall surface" may be utilized interchangeably. The utilization of one term in some instances and the other in other instances may be to provide language variation within this disclosure to simplify antecedent basis within the claims that follow.

The opening 64 may be representative of a large number of substantially identical openings formed at the process stage of FIGS. 6 and 6A and utilized for fabricating NAND memory cells of a NAND memory array. The term "substantially identical" means identical to within reasonable tolerances of fabrication and measurement.

Figure 7:
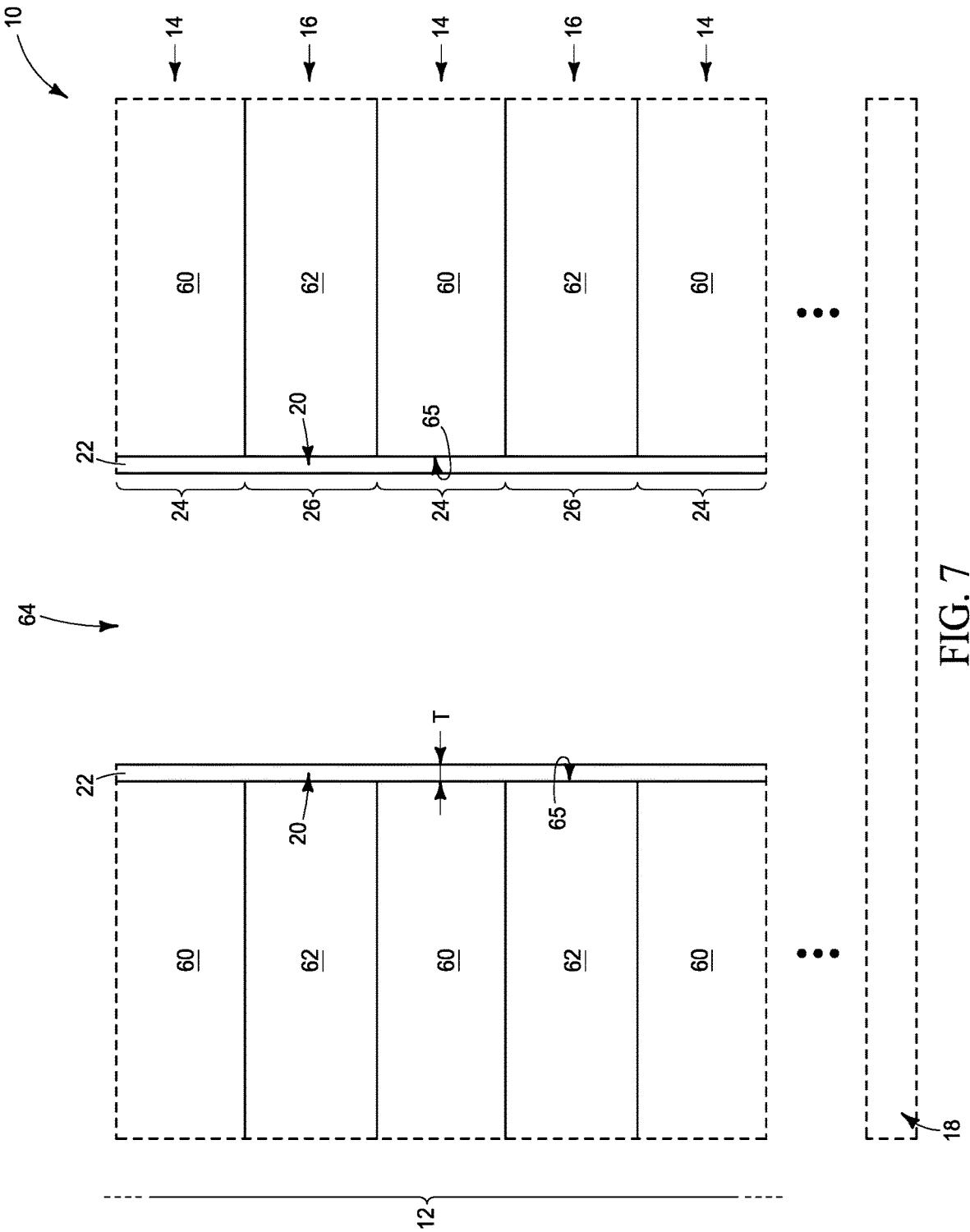
FIGS. 7-9 are diagrammatic cross-sectional side views of the region of the integrated assembly of FIG. 5 shown at example sequential process stages of an example method for forming an example NAND memory array. The process stage of FIG. 7 may follow that of FIG. 6.

Referring to FIG. 7, a liner 20 is formed along the peripheral sidewall 65. The liner comprises a liner material 22. The liner material 22 may function as an etch-stop in subsequent processing, and may comprise any suitable composition(s).

In some embodiments, the liner material 22 may be a carbon-containing material. For instance, the liner material 22 may comprise, consist essentially of, or consist of carbon in combination with one or more of silicon, oxygen and nitrogen.

In some embodiments, the liner material 22 may comprise, consist essentially of, or consist of SiOC, where the chemical formula indicates primary constituents rather than a specific stoichiometry; and wherein the carbon is present to a concentration within a range of from about 1 atomic percent (at %) to about 50 at %. In some embodiments, the carbon may be present in the SiOC to a concentration within a range of from about 4 at % to about 20 at %.

In some embodiments, the liner material 22 may comprise, consist essentially of, or consist of SiC, where the chemical formula indicates primary constituents rather than a specific stoichiometry; and wherein the carbon is present to a concentration within a range of from about 1 atomic percent (at %) to about 50 at %. In some embodiments, the carbon may be present in the SiC to a concentration within a range of from about 4 at % to about 20 at %.

In some embodiments, the liner material 22 may comprise, consist essentially of, or consist of SiNC, where the chemical formula indicates primary constituents rather than a specific stoichiometry; and wherein the carbon is present to a concentration within a range of from about 1 part per million (ppm) to about 5 at %.

In some embodiments, the liner material 22 may comprise, consist essentially of, or consist of one or more metals (e.g., one or both of tungsten and ruthenium).

The liner may comprise any suitable horizontal thickness, T. In some embodiments such horizontal thickness may be within a range of from about 1 nm to about 12 nm; within a range of from about 2 nm to about 4 nm; etc.

Although the liner 20 is shown to have a single homogenous composition, in other embodiments (not shown) the liner 20 may comprise a laminate of two or more different compositions.

The liner 20 may be considered to have first regions 24 along the first levels 14, and to have second regions 26 along the second levels 16.

Figure 8:
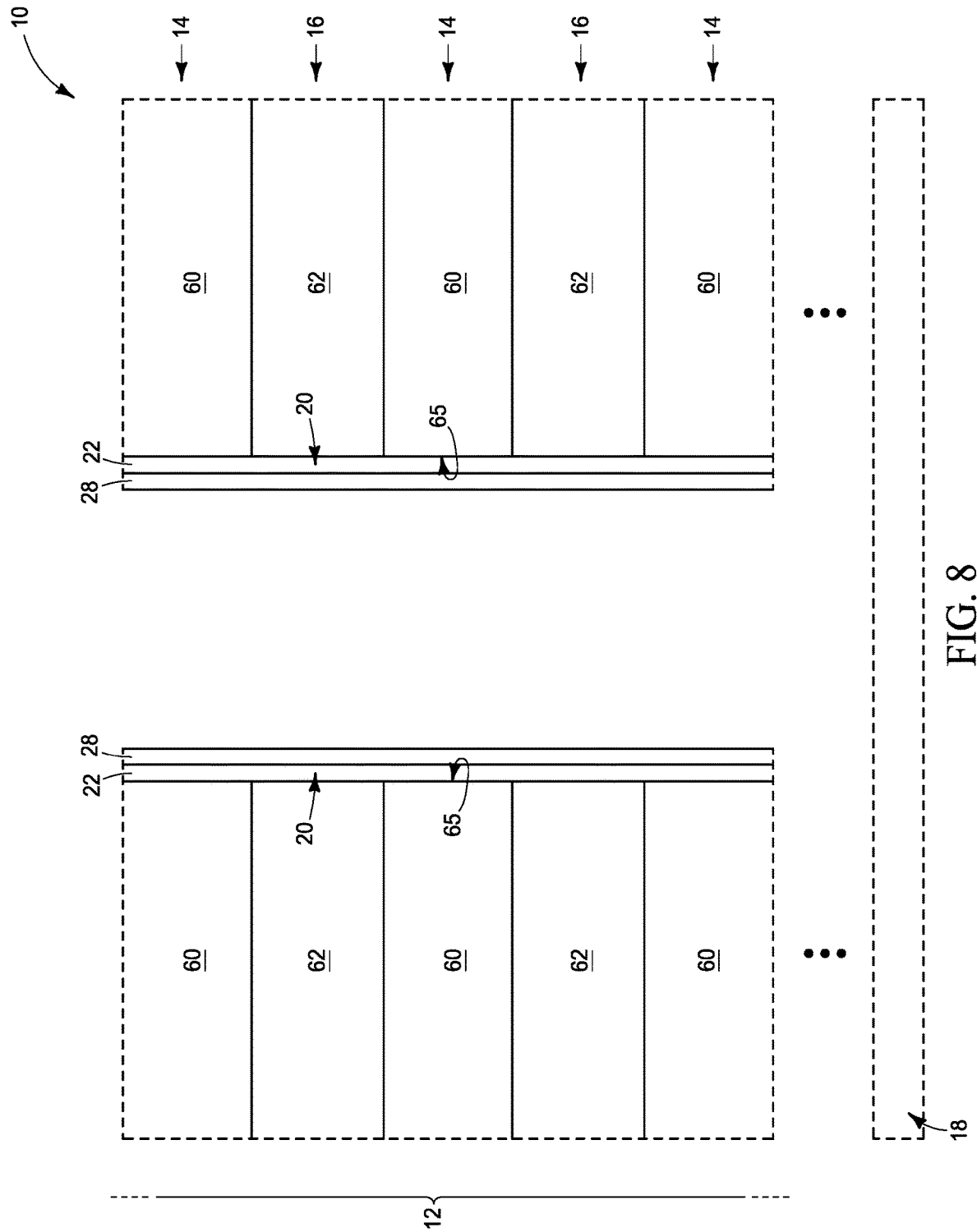

Referring to FIG. 8, high-k dielectric material (dielectric-barrier material) 28 is formed along the liner 20 (adjacent the liner 20). The dielectric-barrier material 28 may be considered to be adjacent the sidewall 65 of the opening 64 even though it is spaced from the sidewall by the liner 20 in the shown embodiment.

The term "high-k" means a dielectric constant greater than that of silicon dioxide. In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The high-k dielectric material 28 has a substantially uniform thickness, with the term "substantially uniform" meaning uniform to within reasonable tolerances of fabrication and measurement. The high-k dielectric material 28 may be formed to any suitable thickness; and in some embodiments may be formed to a thickness within a range of from about 1 nm to about 5 nm.

Figure 9:
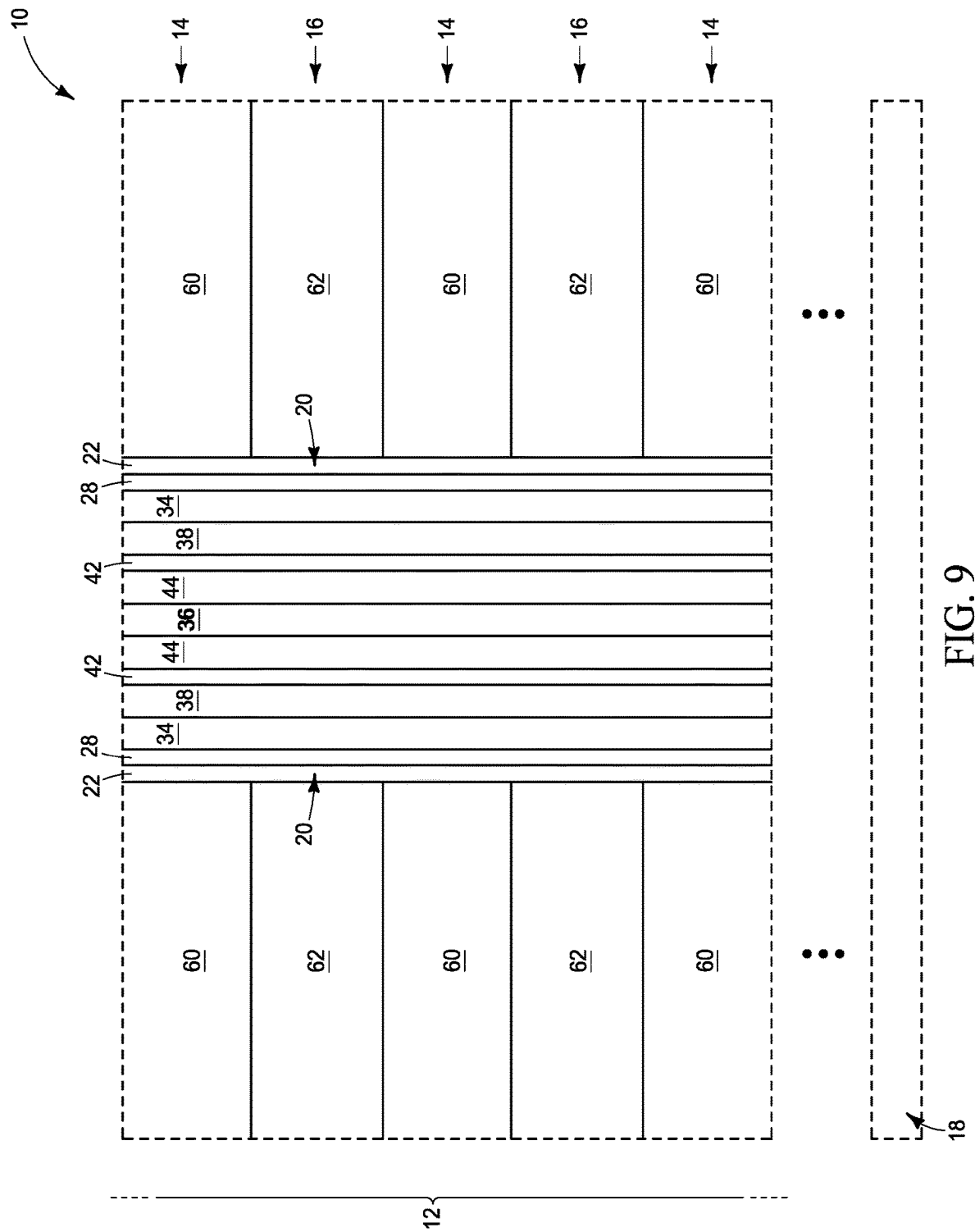
Figure 9A:
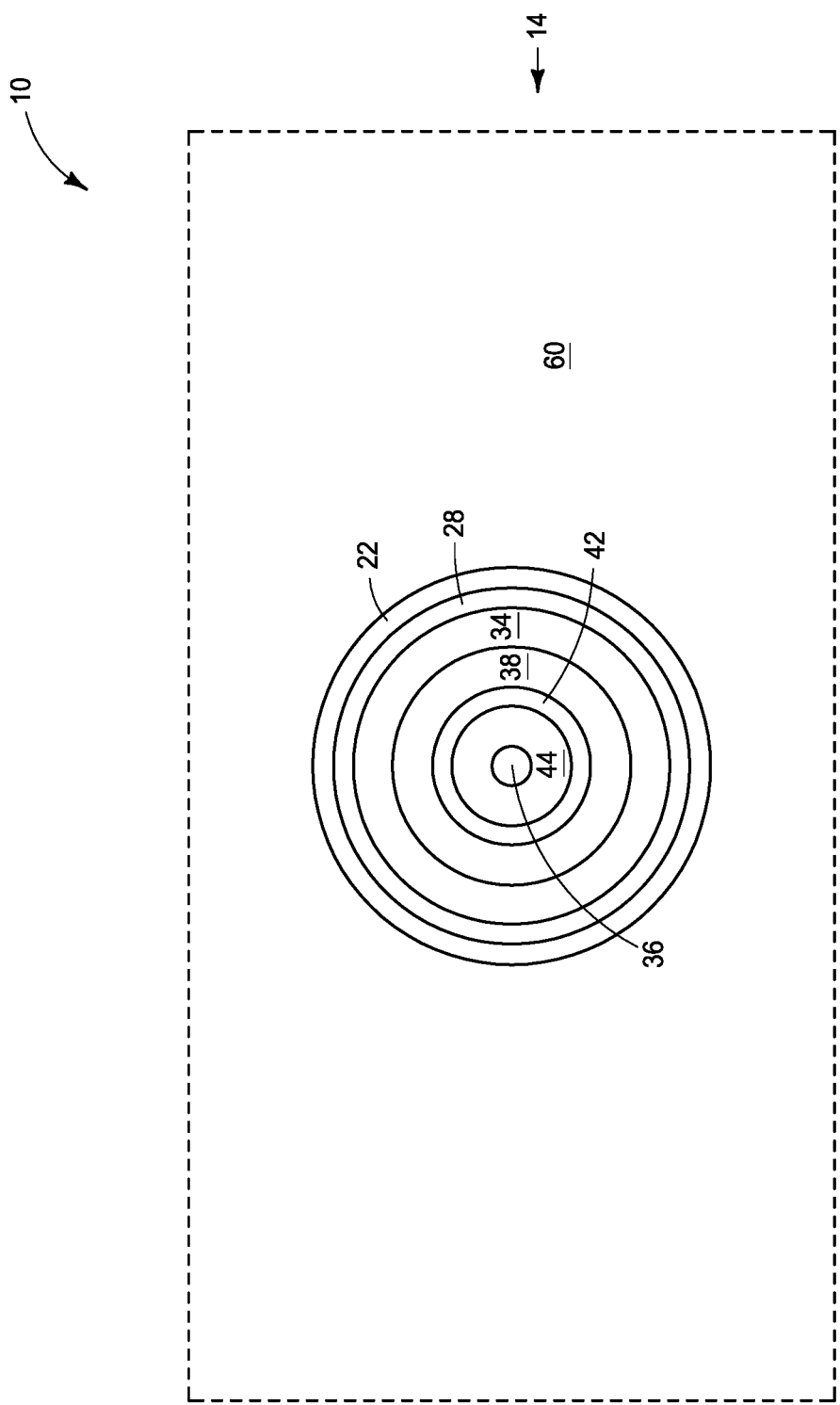
FIG. 9A is a diagrammatic top-down view of a portion of the integrated assembly of FIG. 9.

Referring to FIGS. 9 and 9A (with FIG. 9A being a top-down view through one of the levels 14 of FIG. 9), charge-blocking material 34 is formed along the dielectric-barrier material 28. The charge-blocking material 34 may comprise any suitable composition(s); and in some embodiments may comprise, consist essentially of, or consist of one or both of silicon oxynitride (SiON) and silicon dioxide ($SiO_2$).

Charge-storage material 38 is formed adjacent the charge-blocking material 34. The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

The charge-storage material 38 has a flat configuration in the illustrated embodiment of FIG. 9. The term "flat configuration" means that the material 38 is of substantially continuous thickness and extends substantially vertically straight, as opposed to being undulating.

Gate-dielectric material (i.e., tunneling material, charge-passage material) 42 is formed adjacent the charge-storage material 38. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is formed adjacent the gate-dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 36 is formed adjacent the channel material 44, and fills a remaining portion of the opening 64 (FIG. 8). The insulative material 36 may comprise any suitable composition(s); and in some embodiments may comprise, consist essentially of, or consist of silicon dioxide.

In the illustrated embodiment of FIGS. 9 and 9A, the channel material 44 is configured as an annular ring which surrounds the insulative material 36. Such configuration of the channel material may be considered to comprise a hollow channel configuration, in that the insulative material 36 is provided within a "hollow" in the annular-ring-shaped channel configuration. In other embodiments (not shown), the channel material may be configured as a solid pillar configuration.

Figure 10:
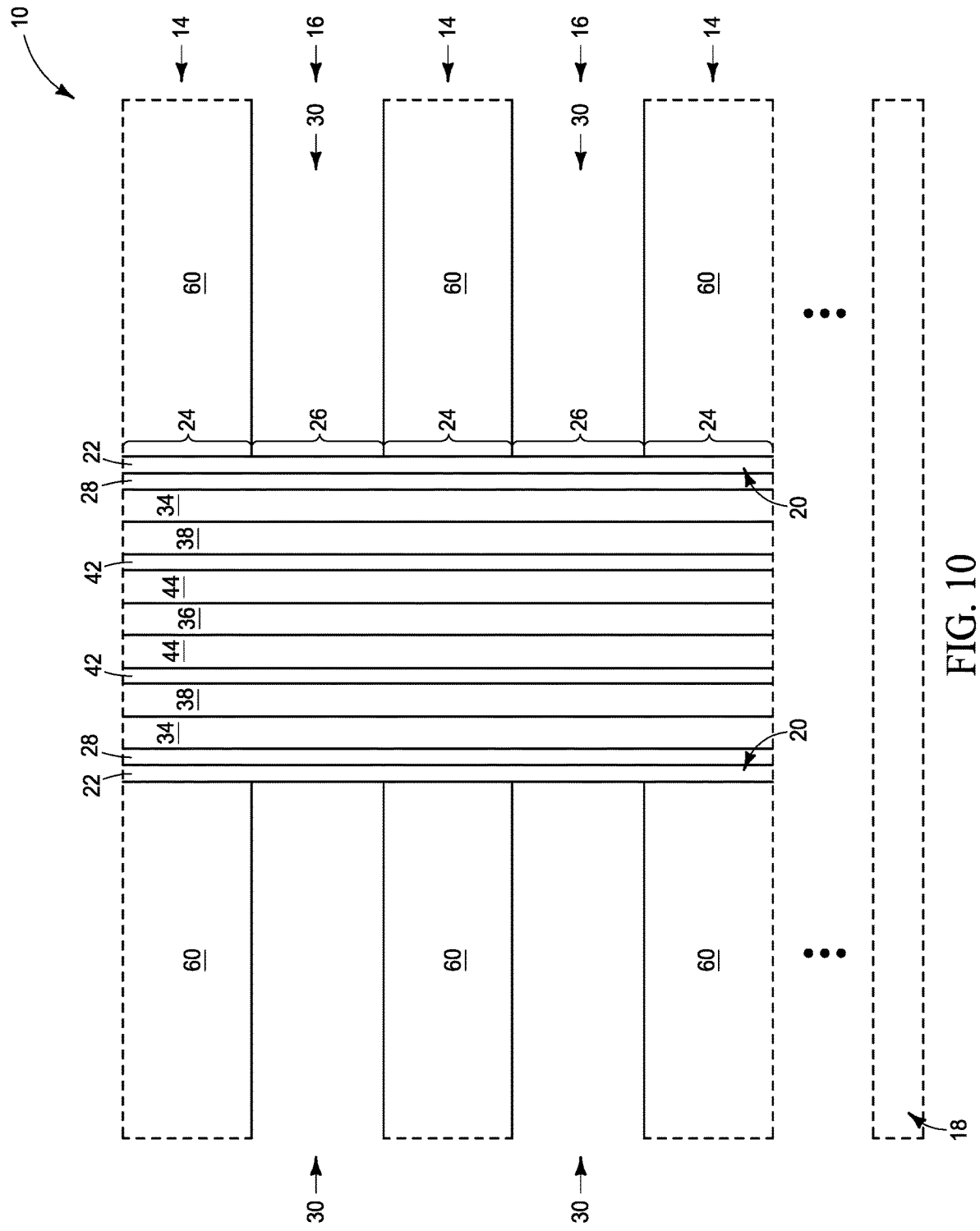
FIGS. 10-14 are diagrammatic cross-sectional side views of the region of the integrated assembly of FIG. 5 shown at example sequential process stages of an example method for forming an example NAND memory array. The process stage of FIG. 10 may follow that of FIG. 9.

Referring to FIG. 10, the second material 62 (FIG. 9) is removed to leave voids 30 along the second levels 16 (i.e., between the first levels 14). The voids 30 may be referred to as first voids to distinguish them from other voids which are formed at later process stages.

The voids 30 may be formed with any suitable process which removes the material 62 (FIG. 9) selectively relative to the materials 60 and 22. In some embodiments such process may utilize hot phosphoric acid.

The second regions 26 of the liner 20 are exposed by the voids 30.

Figure 11:
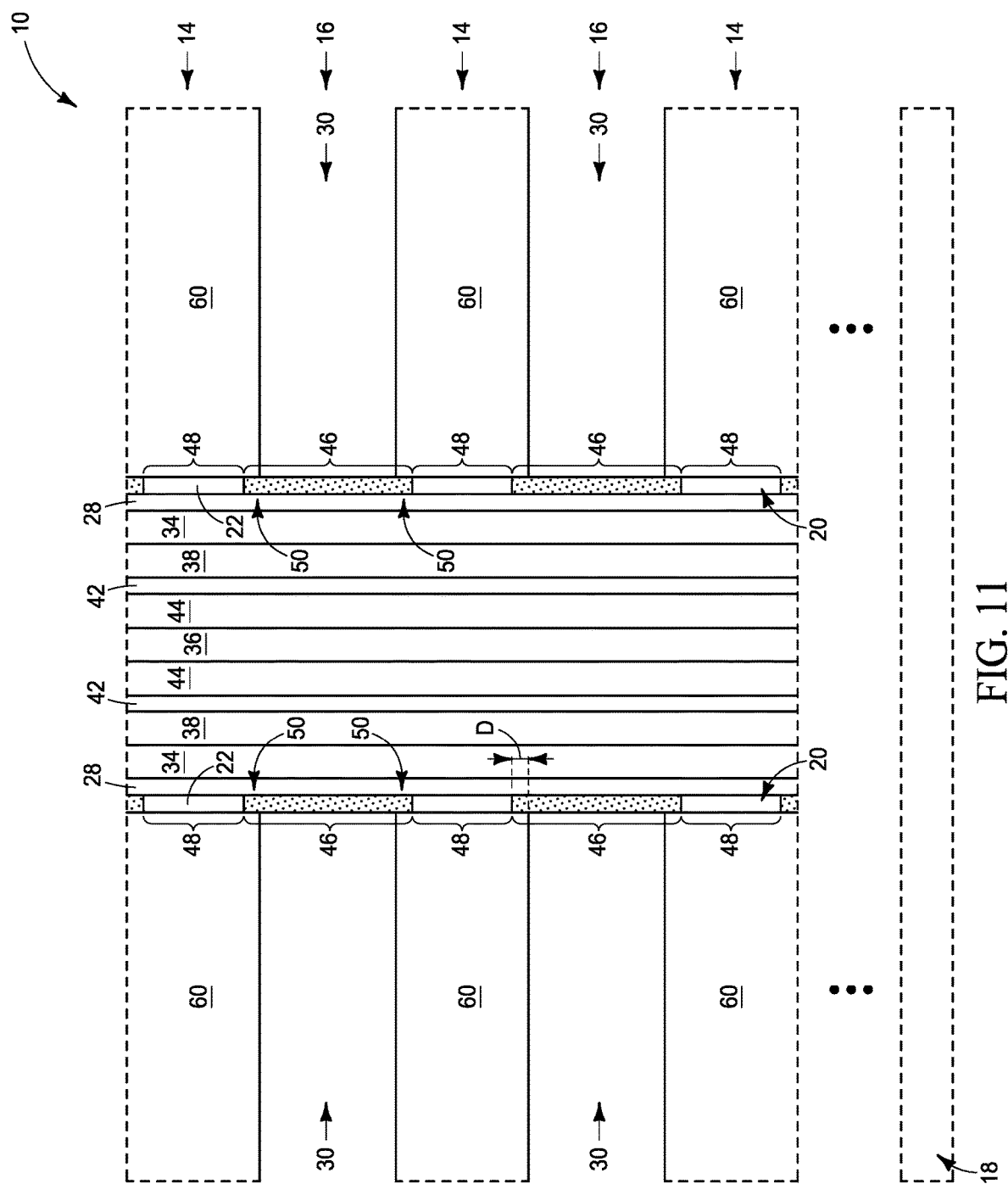

Referring to FIG. 11, the exposed second regions 26 (FIG. 10) of the liner 20 are oxidized to form oxidized segments 46. In the shown embodiment, stippling is utilized to assist the reader in identifying the oxidized segments 46. The oxidized segments 46 may be referred to as first segments. Such first segments 46 vertically alternate with non-oxidized second segments 48 of the liner 20. In the shown embodiment, the oxidized first segments extend beyond the second regions 26 of the liner (FIG. 10, with such first regions being the regions along the second levels 16) to include terminal portions 50 along the first levels 14. The terminal portions 50 may be considered to extend to a distance D beyond the second levels. Such distance D may be 0 in some embodiments (i.e., the terminal portions 50 may not exist). In other embodiments, the distance D may be greater than 0, greater than 0.5 nm, greater than 1 nm, greater than 2 nm, etc. In some example embodiments, the distance D may be within a range of from about 0 to about 10 nm, within a range of from about 0 to about 4 nm, etc.

The oxidized regions (oxidized segments, first segments) 46 may be formed with any suitable conditions; including, for example, exposure to one or more of $O_2$, $H_2O_2$, $O_3$, etc.

In some embodiments, the liner material 22 comprises a carbon-containing material, and the oxidized regions 46 comprise an oxidized form of the carbon-containing material. Such oxidized form may have the physical characteristics of a powdery material or fluff.

Figure 12:
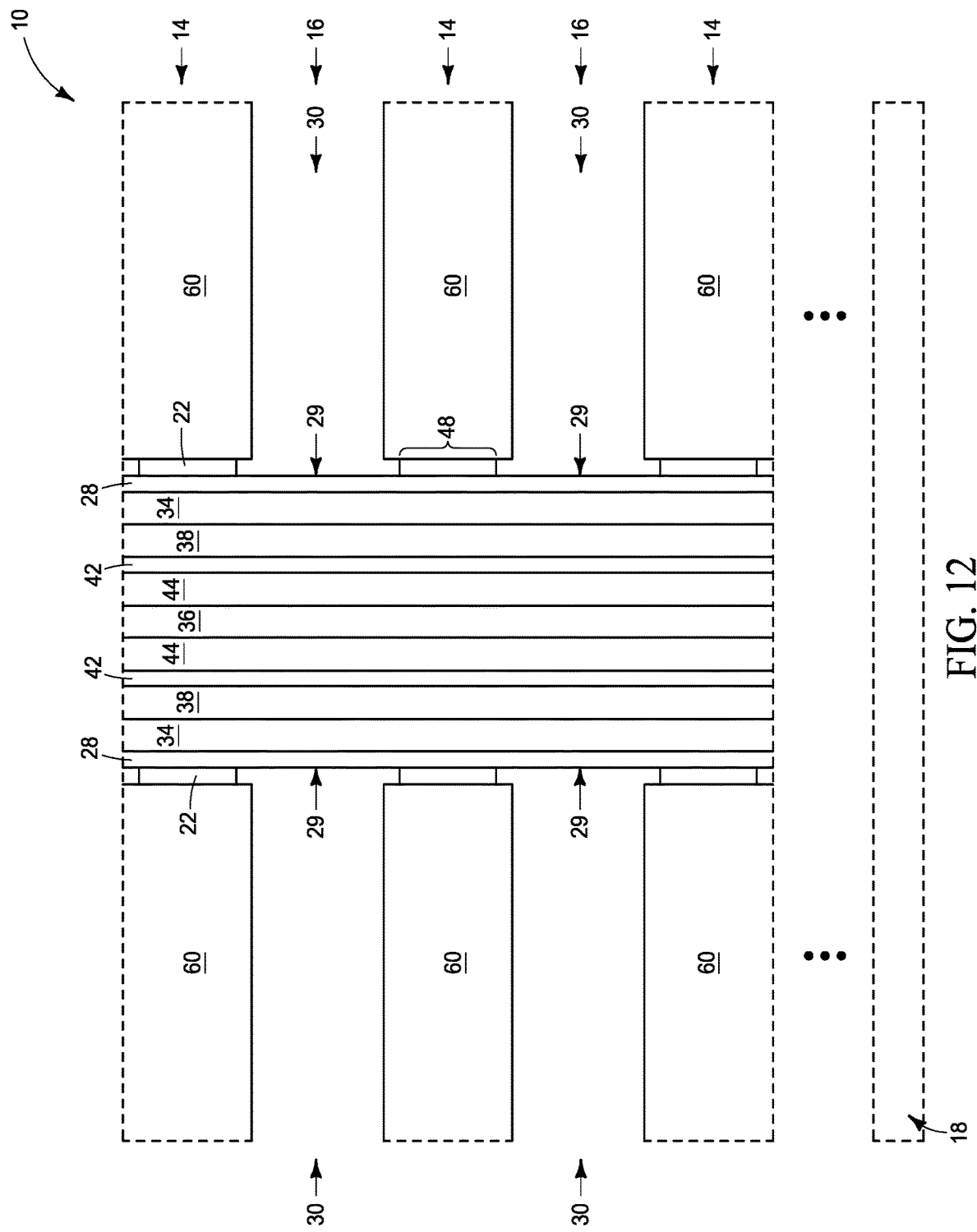

Referring to FIG. 12, the oxidized segments 46 (FIG. 11) are removed. Such removal may be accomplished with any suitable processing. For instance, if the oxidized segments 46 comprise silicon, carbon and oxygen, the removal of such segments may utilize an etchant comprising hydrofluoric acid. The removal of the oxidized segments 46 exposes surfaces 29 of the dielectric-barrier material 28.

It is noted that in some embodiments the oxidation of FIG. 11 may be omitted, and the exposed segments 26 of the liner material 22 of FIG. 10 may simply be removed with one or more appropriate etches to form a configuration analogous to that of FIG. 12. For instance, in some embodiments the liner material 22 may comprise one or more metals, and such may be removed with appropriate etching without first oxidizing such metal.

Figure 13:
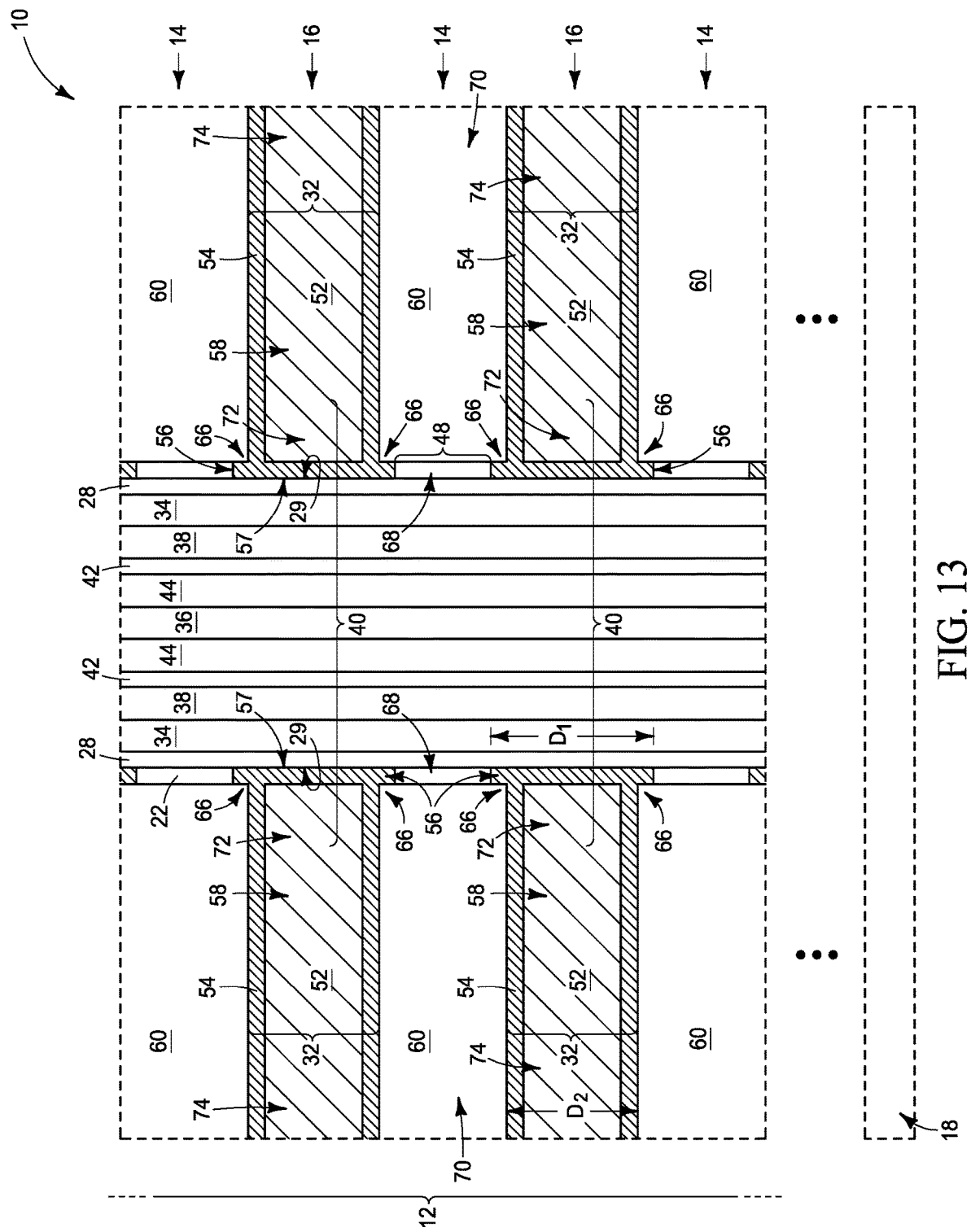

Referring to FIG. 13, conductive regions 32 are formed within the voids 30 (FIG. 10).

The conductive regions 32 may comprise two or more conductive materials; and in the shown embodiment comprise a pair of conductive materials 52 and 54. The conductive materials 52 and 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 52 and 54 are compositionally different from one another.

The material 52 may be referred to as a conductive core material, and the material 54 may be referred to as a conductive liner material. The conductive liner material 54 is along an outer periphery of the conductive core material 52.

In some embodiments the conductive core material 52 may comprise one or more metals (e.g., may comprise tungsten), and the conductive liner material 54 may comprise one or more metal nitrides (e.g., may comprise titanium nitride).

In the shown embodiment, the high-k dielectric material 28 is directly against the conductive liner material 54.

The levels 16 may be considered to be conductive levels at the process stage of FIG. 13, with such conductive levels comprising the conductive regions 32. The conductive levels 16 alternate with the insulative levels 14 in the vertical stack 12 at the process stage of FIG. 13.

The conductive levels 16 have terminal regions 56 facing the dielectric-barrier material 28, and have nonterminal regions 58 proximate the terminal regions 56. In the illustrated embodiment, the terminal regions 56 comprise only the conductive liner material 54, and the nonterminal regions 58 comprise both the conductive liner material 54 and the conductive core material 52. The conductive liner material 54 has a substantially uniform thickness along the nonterminal and terminal regions (with the term "substantially uniform thickness" meaning a uniform thickness to within reasonable tolerances of fabrication and measurement).

The conductive levels 16 may be considered to have front surfaces 57 along the terminal regions 56. Such front surfaces extend along, and are directly against, the dielectric-barrier material 28. In some embodiments, the dielectric-barrier material 28 may be considered to comprise exposed surfaces 29 at the process stage of FIG. 12, and the front surfaces 57 may be considered to be directly against such surfaces 29 of the dielectric-barrier material 28.

The terminal regions 56 join to the nonterminal regions 58 at corners 66. In the illustrated embodiment, such corners have angles of about 90°. The term "about 90°" means 90° to within reasonable tolerances of fabrication and measurement.

The terminal regions 56 are shown to be substantially straight along a vertical direction, and specifically are shown to be vertically straight along the dielectric-barrier material 28. Such may be advantageous in that such may improve coupling of the terminal regions 56 with the charge-storage material 38 as compared to conventional arrangements in which the terminal regions of analogous conductive levels may be curved rather than being vertically straight.

The terminal regions 56 have a first vertical dimension $D_1$ and the nonterminal regions 58 have a second vertical dimension $D_2$. The first vertical dimension $D_1$ may be equal to or greater than the second vertical dimension $D_2$ (i.e., the terminal regions 56 may be vertically thicker than the nonterminal regions 58). In some embodiments, the first vertical thickness $D_1$ may be greater than the second vertical thickness $D_2$ by an amount within a range of from about 1 nm to about 20 nm; by an amount within a range of from about 1 nm to about 8 nm, etc.

In the illustrated embodiment, the nonterminal regions 58 are substantially vertically-centered relative to the terminal regions 56 along each of the conductive levels 16 (where the term "substantially vertically-centered" means vertically-centered to within reasonable tolerances of fabrication and measurement).

The insulative levels 14 may be considered to have first regions 68 between the terminal regions 56 of the vertically-neighboring conductive levels 16, and to have second regions 70 between the nonterminal regions 58 of the vertically-neighboring conductive levels. The first regions 68 comprise a different composition than the second regions 70 in the illustrated embodiment of FIG. 13. Specifically, the first regions 68 comprise the liner material 22, and the second regions 70 comprise the insulative material 60. In some embodiments, the insulative material 60 may comprise, consist essentially of, or consist of silicon dioxide; and the liner material 22 may comprise carbon (e.g., may comprise carbon in combination with one or more of silicon, oxygen and nitrogen).

The conductive levels 16 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is indicated to extend vertically beyond the illustrated region to show that there may be more vertically-stacked levels than those specifically illustrated in the diagram of FIG. 13.

NAND memory cells 40 comprise the dielectric-barrier material 28, charge-blocking material 34, charge-storage material 38, gate-dielectric material 42 and channel material 44. The illustrated NAND memory cells 40 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 40 includes a control gate region 72 within a conductive level 16. The control gate regions 72 comprise control gates analogous to those described above with reference to FIGS. 1-4. The conductive levels 16 comprise regions 74 adjacent to (proximate) the control gate regions 72. The regions 74 may be referred to as routing regions or wordline regions. The control gate regions 72 include the terminal regions 56 of the conductive levels 16, and the routing regions 74 include the nonterminal regions 58 of the conductive levels 16.

Figure 14:
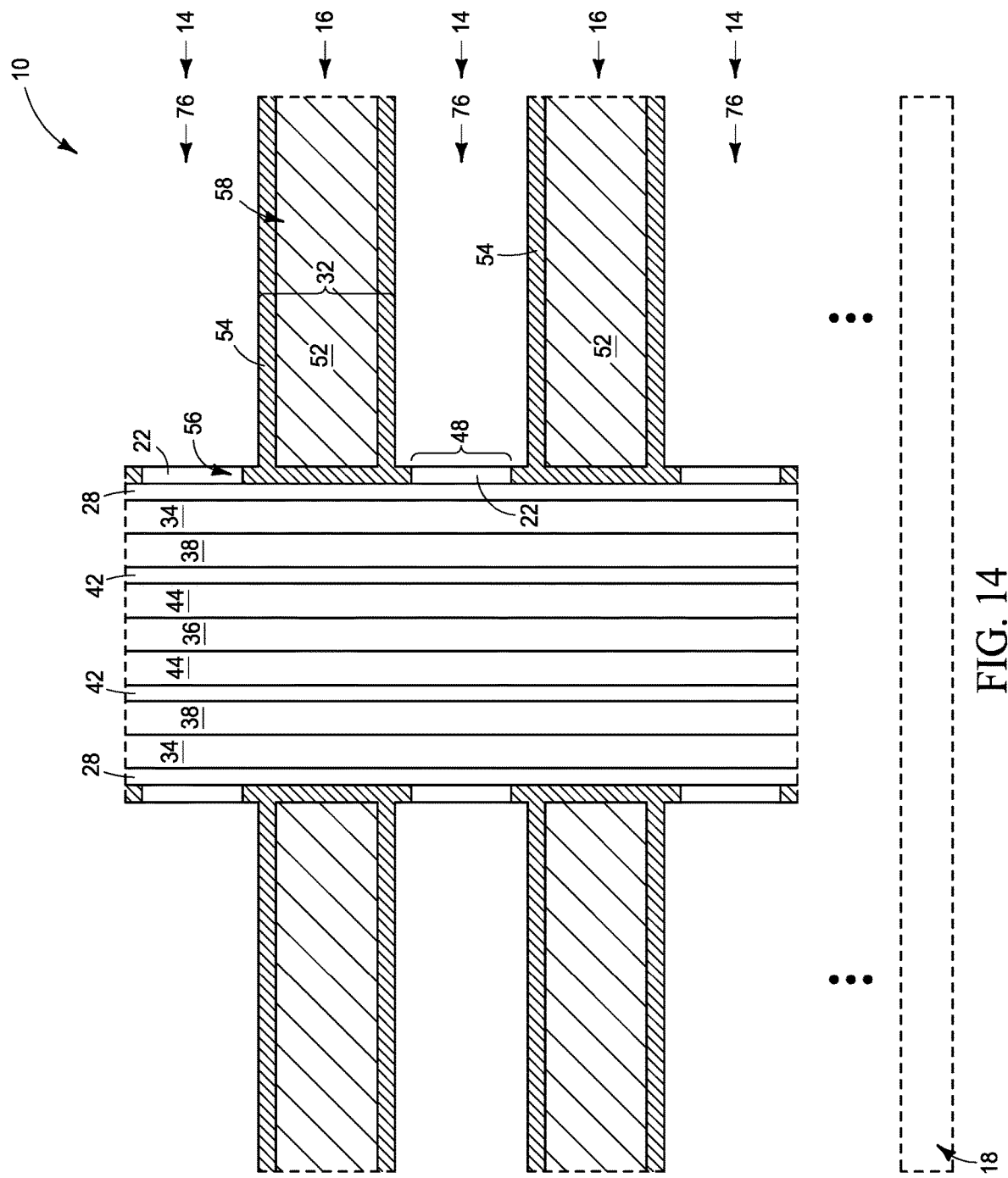

The configuration of FIG. 13 may be a final structure of a memory arrangement (e.g., an assembly configured to include NAND memory). Alternatively, the configuration of FIG. 13 may be subjected to further processing to form a memory arrangement. For instance, FIG. 14 shows a process stage which may follow that of FIG. 13. The first material 60 (FIG. 13) is removed to form second voids 76 (i.e., to leave the second voids 76) along the levels 14. The formation of the second voids 76 exposes the remaining segments 48 of the liner material 22.

Figure 14A:
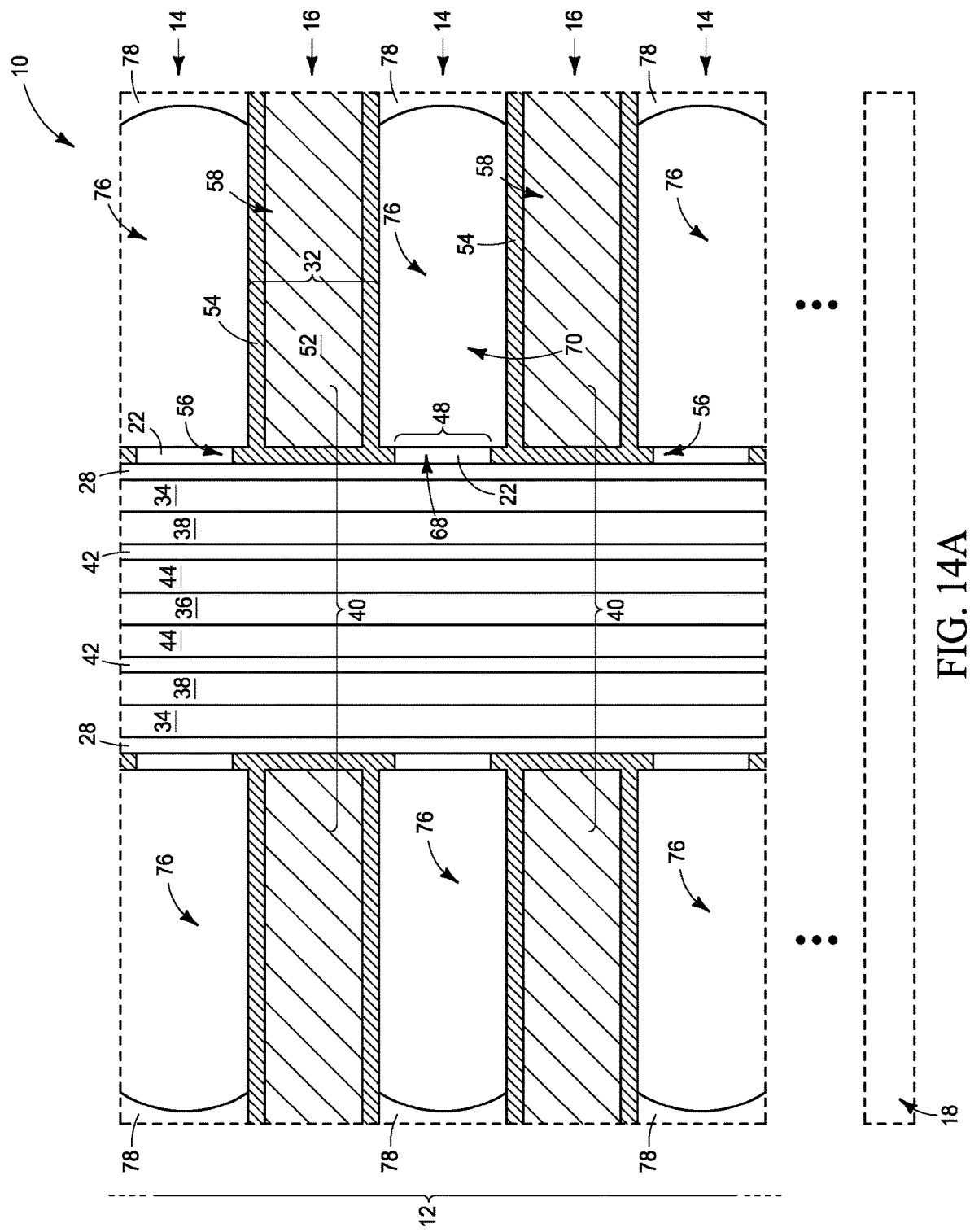
FIG. 14A is a diagrammatic cross-sectional side view of the region of the integrated assembly of FIG. 5 shown at an example sequential process stage which may follow that of FIG. 14.

FIG. 14A shows a process stage which may follow that of FIG. 14. Specifically, ends of the voids 76 may be capped with insulative material 78 (e.g., silicon dioxide) to form a final assembly (e.g., a NAND memory assembly) comprising alternating insulative levels 14 and conductive levels 16; with the insulative levels 14 comprising the voids 76, the capping material 78, and the remaining segments 48 of the liner material 22. The voids 76 are between the nonterminal regions 58 of vertically-neighboring conductive levels 16, and the liner material 22 is between the terminal regions 56 of vertically-neighboring conductive levels 16. In other words, the insulative levels 14 may be considered to comprise the liner material 22 within the first regions 68, and to comprise the voids 76 within the second regions 70.

Figure 15:
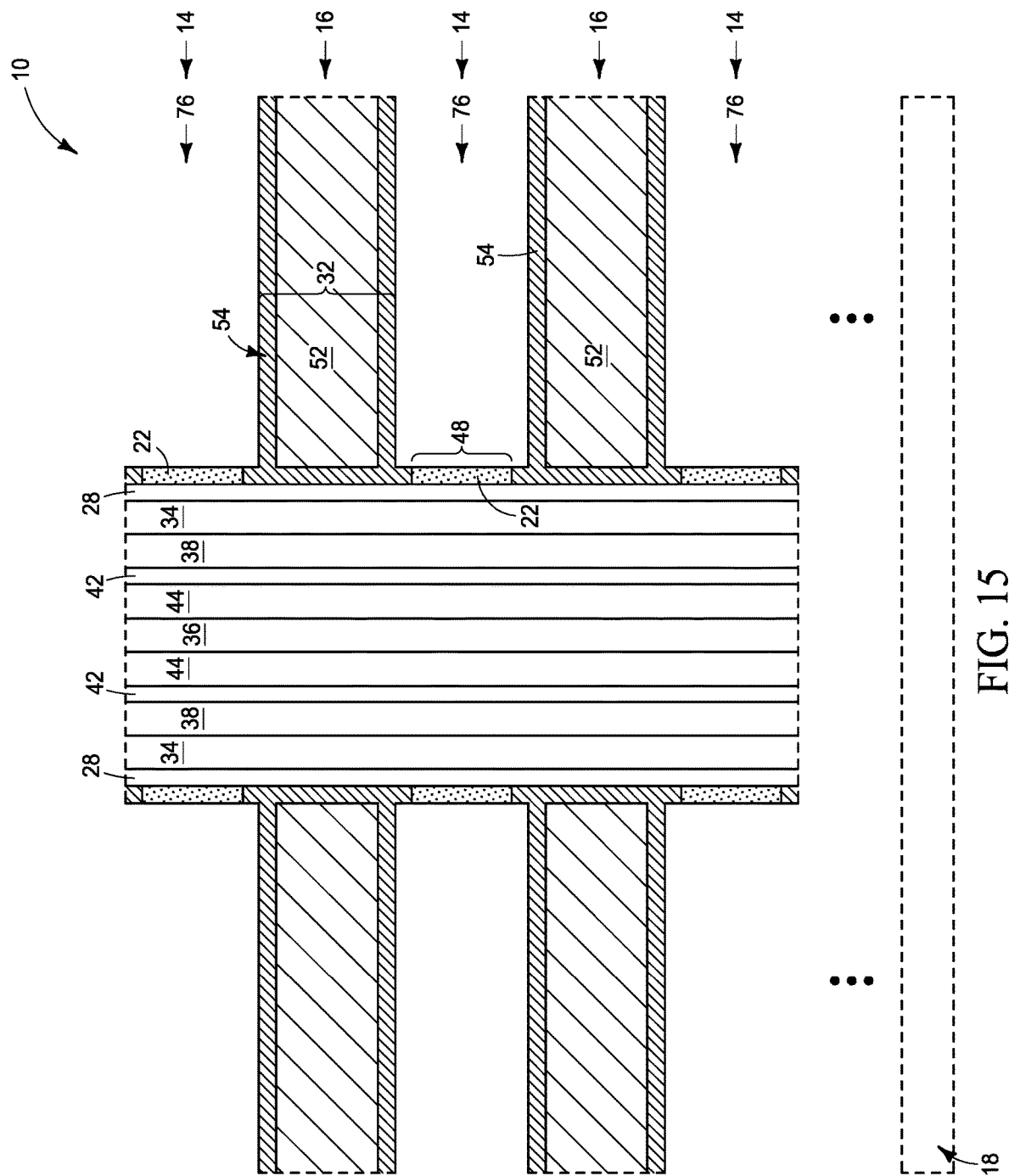
FIG. 15 is a diagrammatic cross-sectional side view of the region of the integrated assembly of FIG. 5 shown at an example sequential process stage which may follow that of FIG. 14.

FIG. 15 shows another process stage which may follow that of FIG. 14. The segments 48 of the liner material 22 are oxidized with processing analogous to that described above with reference to FIG. 11. The oxidized segments 48 may be referred to as oxidized second segments of the liner material.

Figure 15A:
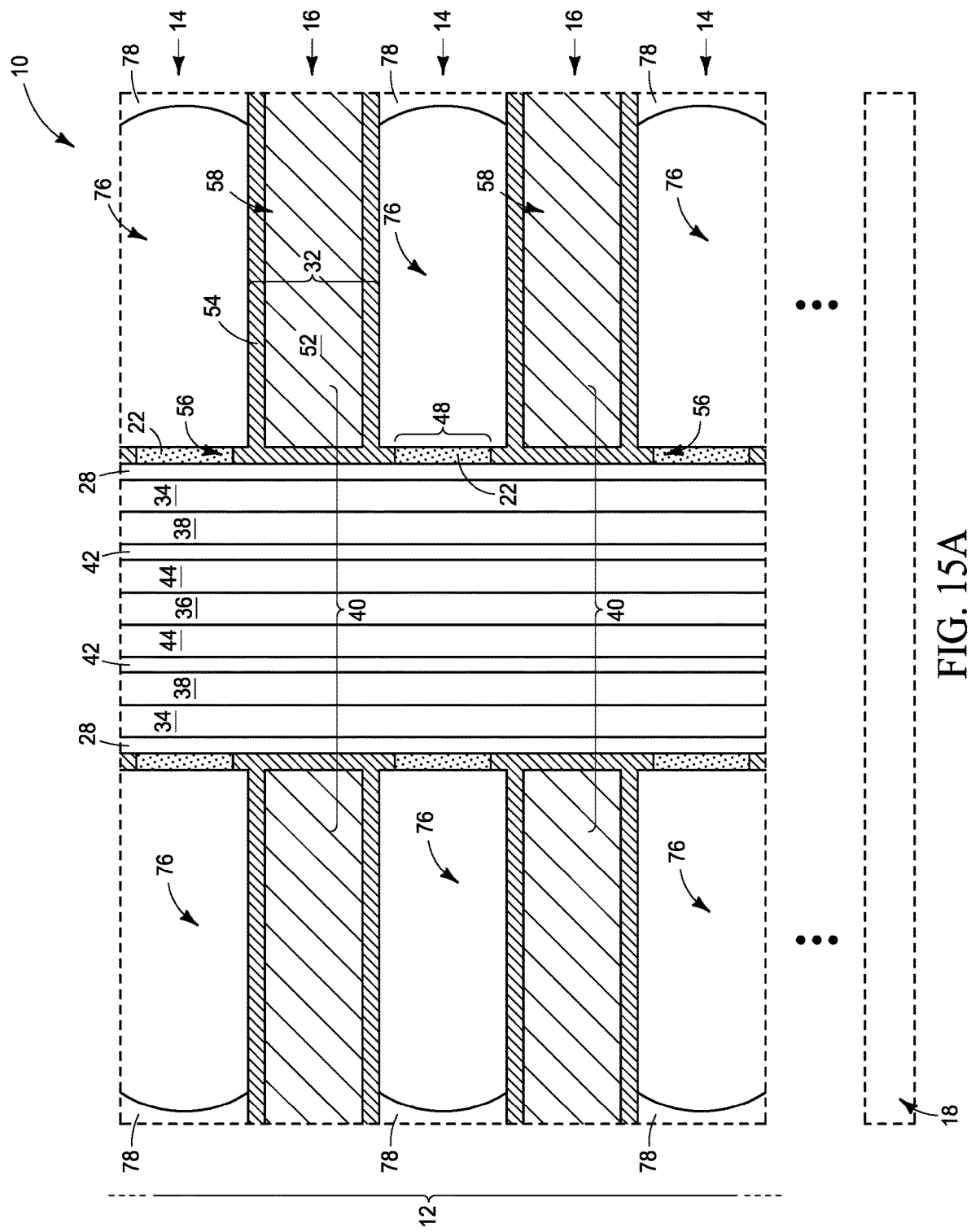
FIG. 15A is a diagrammatic cross-sectional side view of the region of the integrated assembly of FIG. 5 shown at an example sequential process stage which may follow that of FIG. 15.

FIG. 15A shows a process stage which may follow that of FIG. 15. Specifically, ends of the voids 76 are capped with the insulative material 78 with processing analogous to that described above with reference to FIG. 14A to form a final assembly (e.g., a NAND memory assembly). The oxidized regions 48 are between the terminal regions 56 of vertically-neighboring conductive levels 16.

Figure 16:
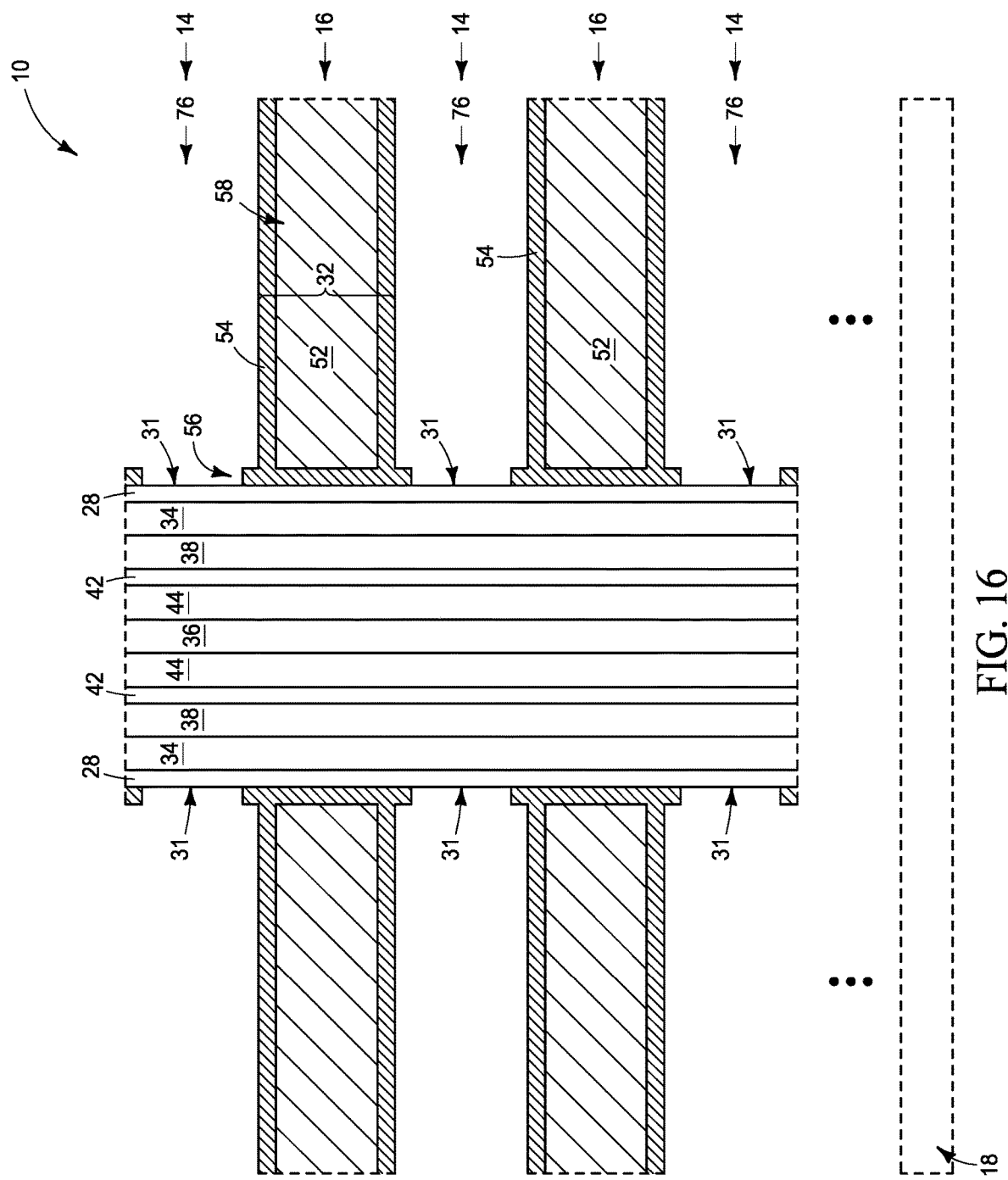
FIG. 16 is a diagrammatic cross-sectional side view of the region of the integrated assembly of FIG. 5 shown at an example sequential process stage which may follow that of FIG. 15.

FIG. 16 shows another process stage which may follow that of FIG. 15. The oxidized segments 48 (FIG. 15) are removed to expose segments 31 of the dielectric-barrier material 28. In some embodiments, the exposed segments 31 may be referred to as second regions of the dielectric-barrier-material to distinguish them from the first regions 29 of the dielectric-barrier material which are exposed at the process stage of FIG. 12. The oxidized segments 48 may be removed with processing analogous to that described above with reference to FIG. 12.

Figure 16A:
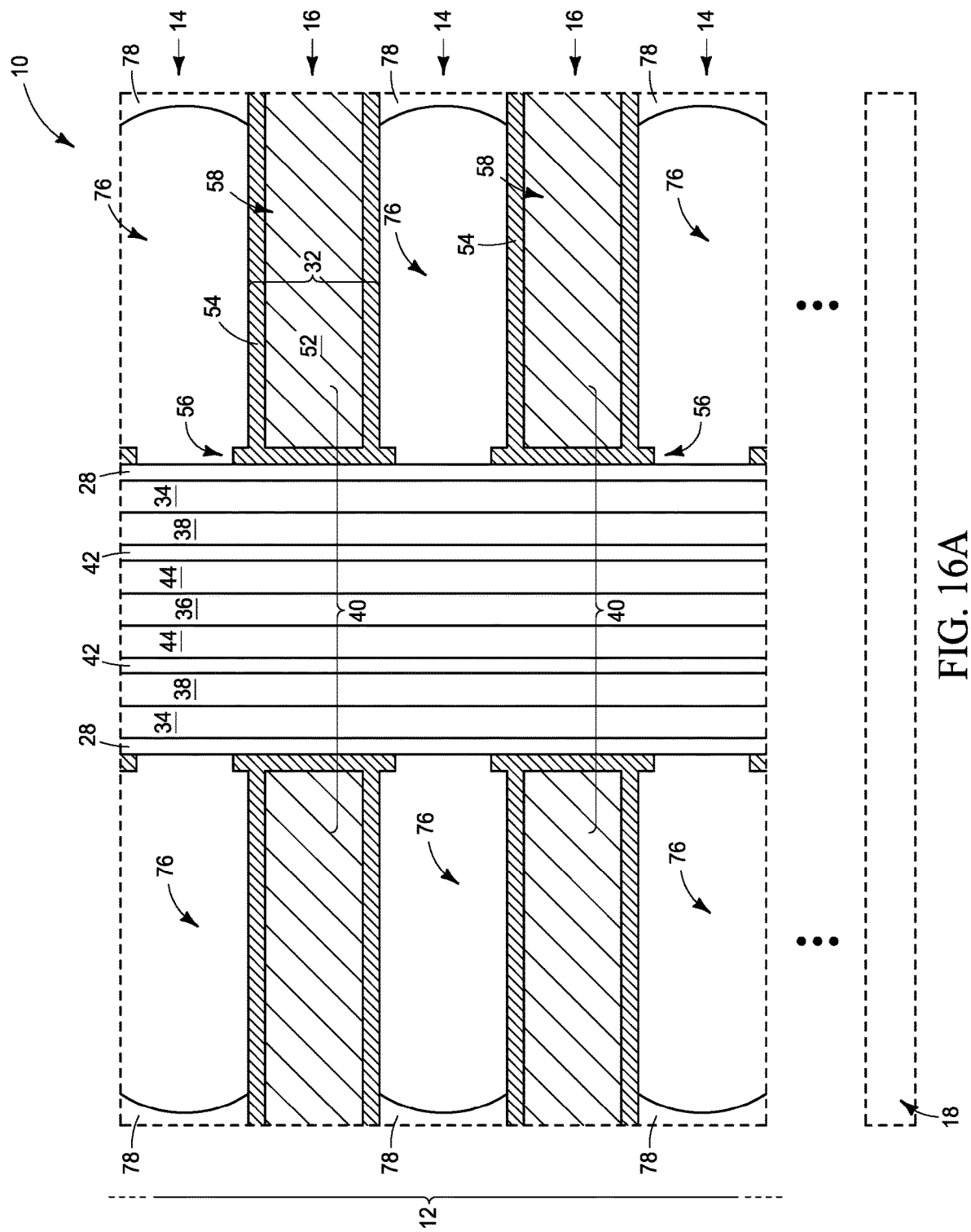
FIG. 16A is a diagrammatic cross-sectional side view of the region of the integrated assembly of FIG. 5 shown at an example sequential process stage which may follow that of FIG. 16.

FIG. 16A shows a process stage which may follow that of FIG. 16. Specifically, ends of the voids 76 are capped with the insulative material 78 with processing analogous to that described above with reference to FIG. 14A to form a final assembly (e.g., a NAND memory assembly). The gaps 76 extend between the terminal regions 56 of vertically-neighboring conductive levels 16, as well as between the nonterminal regions 58 of vertically-neighboring conductive levels 16.

Figure 17:
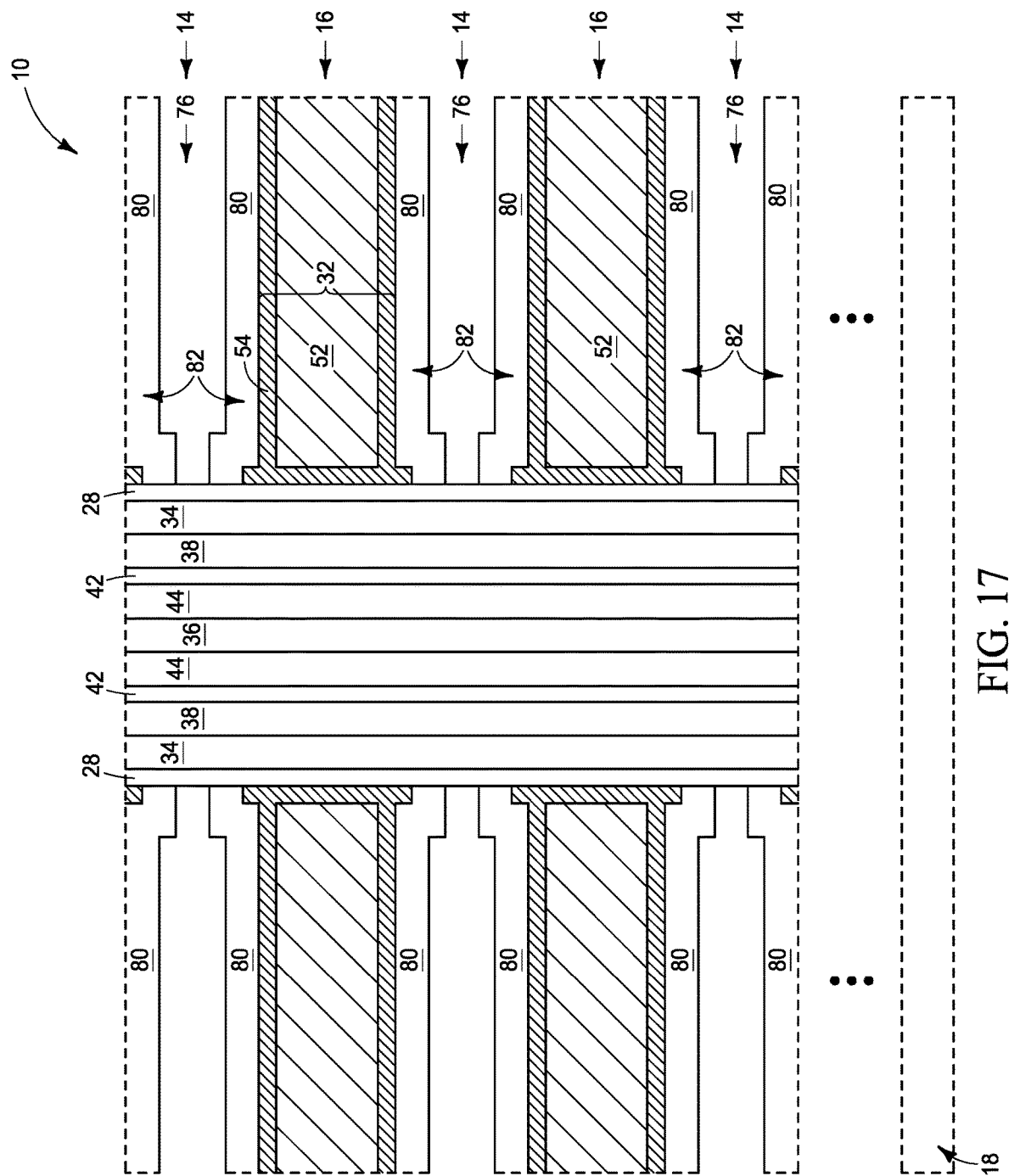
FIGS. 17-20 are diagrammatic cross-sectional side views of the region of the integrated assembly of FIG. 5 shown at example sequential process stages of an example method for forming an example NAND memory array. The process stage of FIG. 17 may follow that of FIG. 16.

FIG. 17 shows another process stage which may follow that of FIG. 16. The second voids 76 are lined with sacrificial material 80 to narrow the second voids 76. The sacrificial material 80 may comprise any suitable composition(s); and in some embodiments may comprise, consist essentially of, or consist of silicon nitride. The sacrificial material 80 may be considered to be configured as strips 82.

Figure 18:
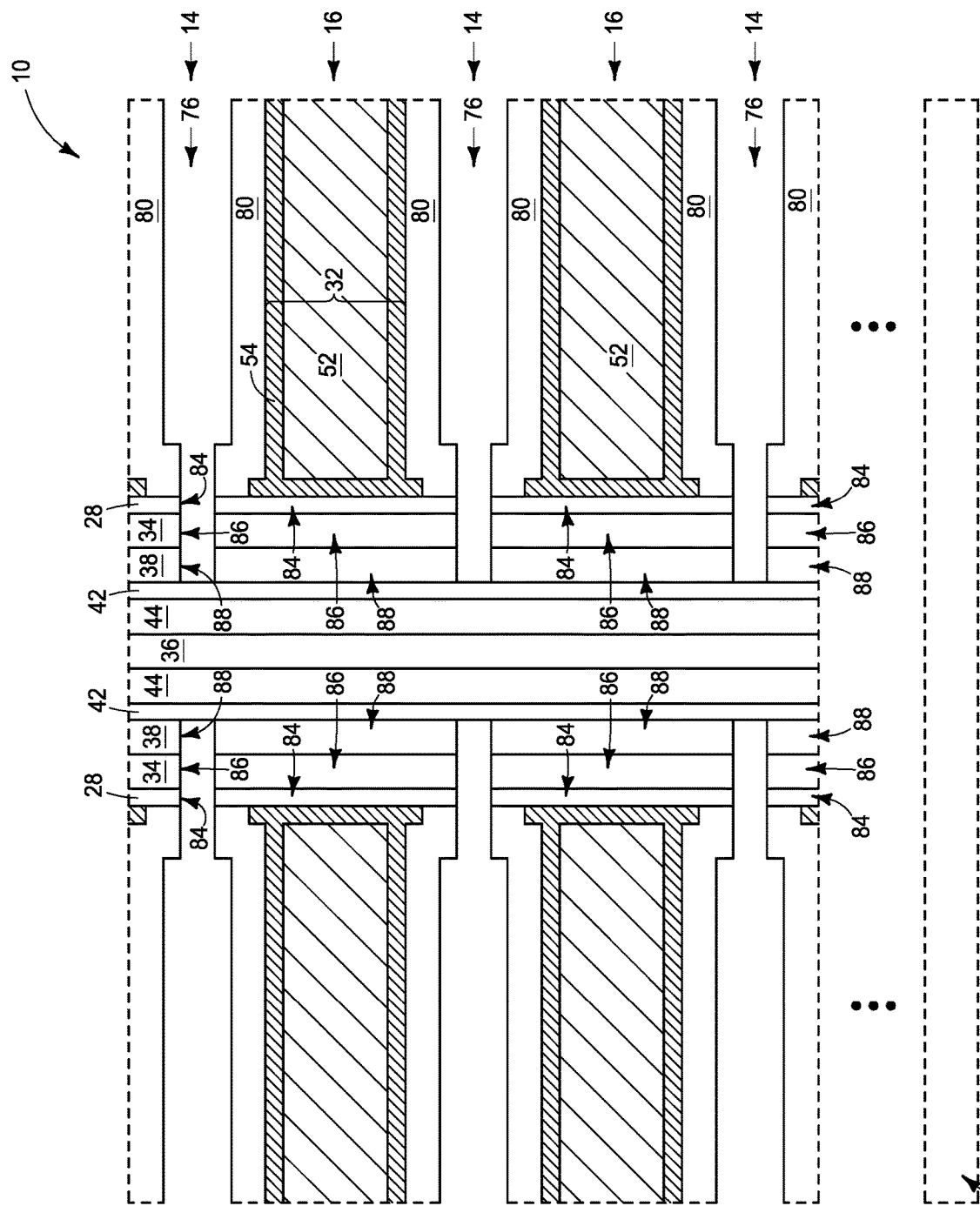

Referring to FIG. 18, the narrowed second voids 76 are extended through the dielectric-barrier material 28, the charge-blocking material 34, and the charge-storage material 38. The extended voids 76 divide the dielectric-barrier material 28 into vertically-spaced first linear segments 84, divide the charge-blocking material 34 into vertically-spaced second linear segments 86, and divide the charge-storage material 38 into vertically-spaced third linear segments 88.

The segments 84, 86 and 88 have substantially flat configurations in the illustrated embodiment of FIG. 18. Also, the channel material 44 has a substantially flat configuration. The flat channel material may positively impact string current as compared to non-flat configurations. Also, the flat segments 88 of the charge-storage material may have a favorable charge distribution.

The embodiment of FIG. 18 shows the voids 76 extending through the materials 28, 34 and 38, and stopping at the tunneling material 42. In other embodiments, the voids 76 may be extended through the tunneling material.

Figure 19:
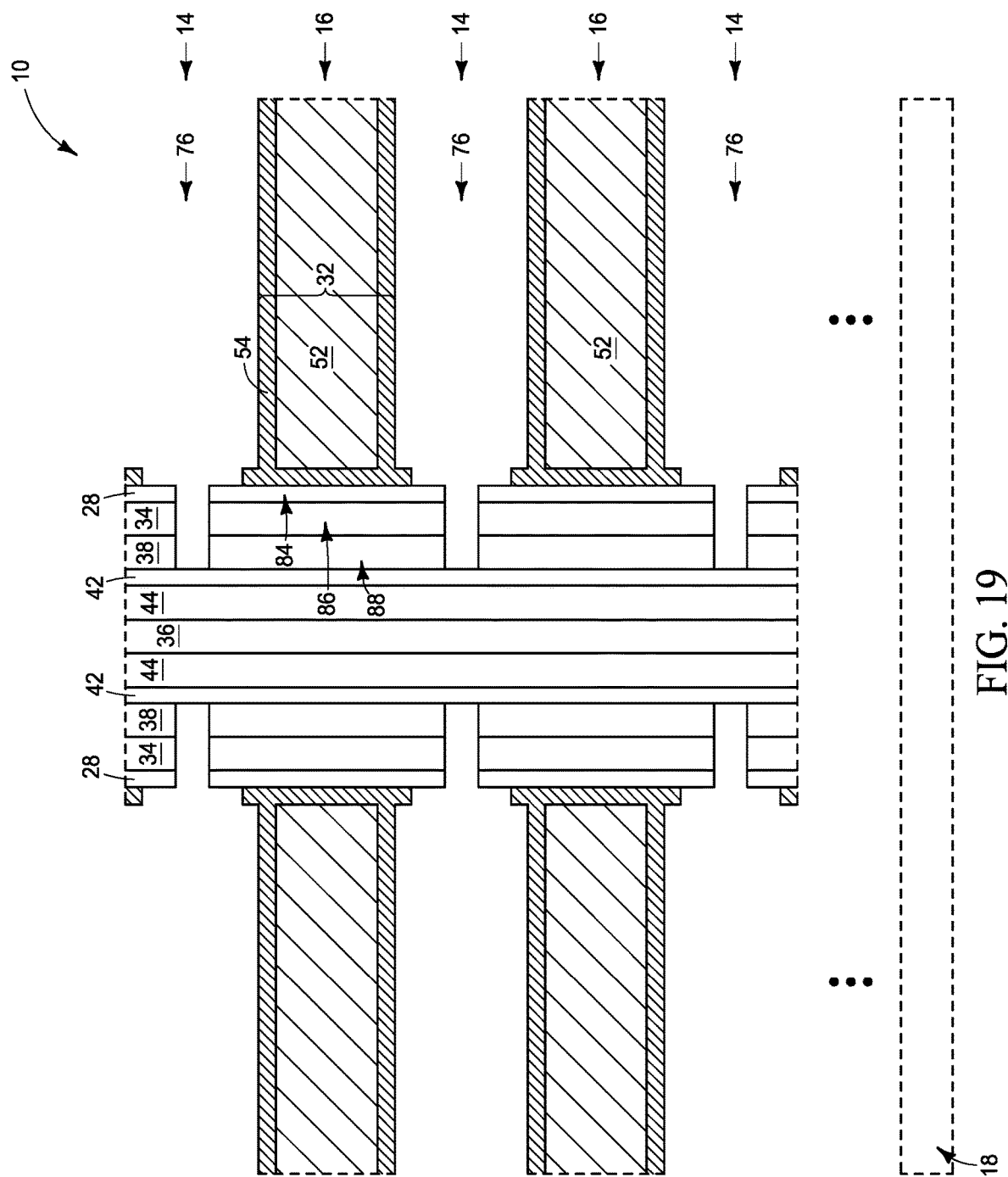

Referring to FIG. 19, the sacrificial material 80 (FIG. 18) is removed.

Figure 20:
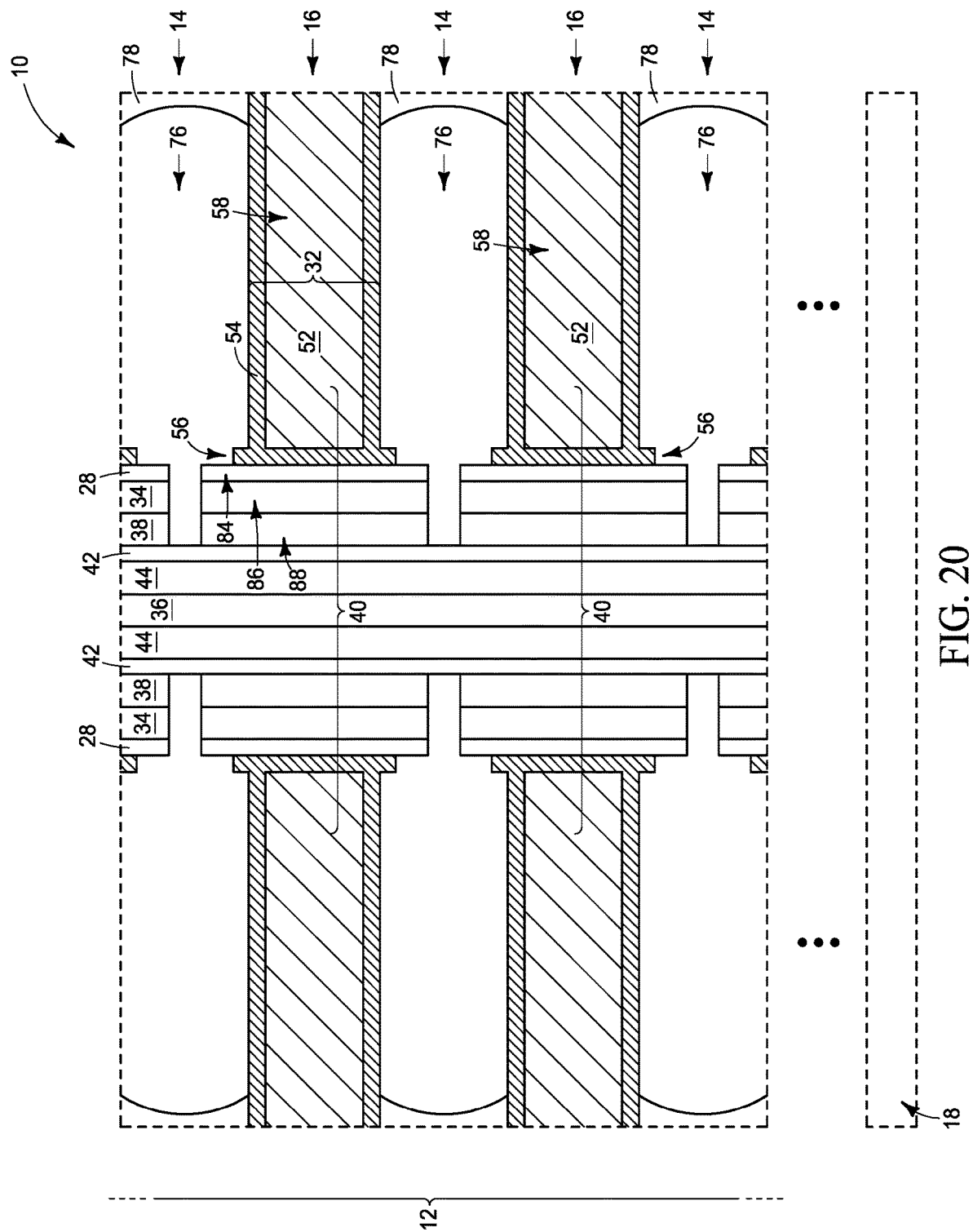

Referring to FIG. 20, ends of the voids 76 are capped with the insulative material 78 with processing analogous to that described above with reference to FIG. 14A to form a final assembly (e.g., a NAND memory assembly). The gaps 76 extend between the terminal regions 56 of vertically-neighboring conductive levels 16, as well as between the nonterminal regions 58 of vertically-neighboring conductive levels 16.

Figure 21:
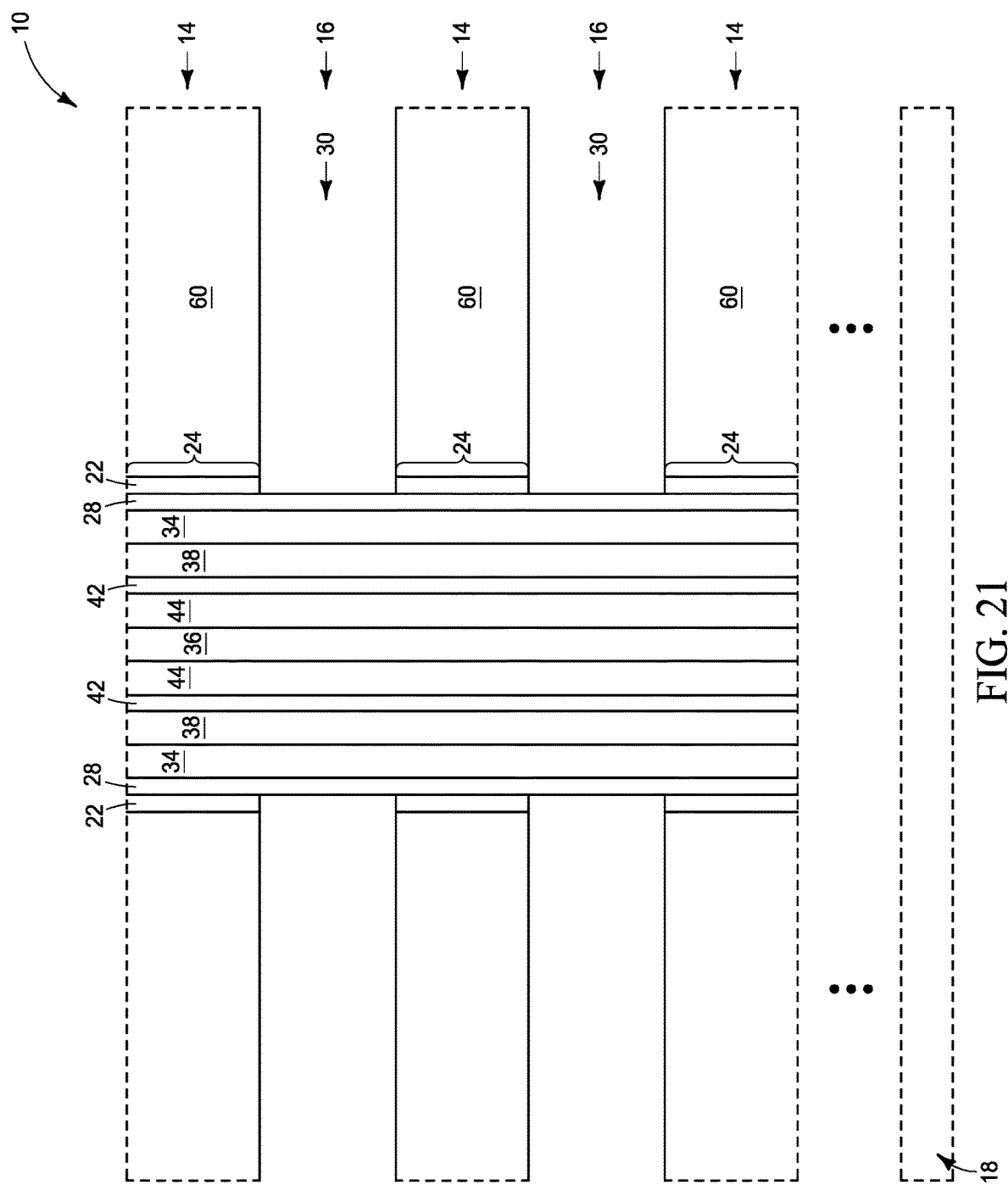
FIGS. 21-27 are diagrammatic cross-sectional side views of the region of the integrated assembly of FIG. 5 shown at example sequential process stages of an example method for forming an example NAND memory array. The process stage of FIG. 21 may follow that of FIG. 10.

As discussed above, in some embodiments the exposed segments 26 of the liner material 22 of FIG. 10 may be directly removed with an appropriate etch, rather than being oxidized in accordance with the processing of FIG. 11. FIG. 21 shows a process stage which may follow that of FIG. 10, and shows the exposed segments 26 (FIG. 10) of the liner material 22 removed with one or more appropriate etches. In some embodiments, the liner material 22 may comprise one or more metals (e.g., one or both of tungsten and ruthenium), and the exposed segments 26 may be removed with etching selective for such metals relative to the dielectric-barrier material 28 and the insulative material 60. An etch is considered to be selective for one material relative to another if the etch removes said one material faster than the other; which may include, which is not limited to, etches which are 100% selective for one material relative to another.

Figure 22:
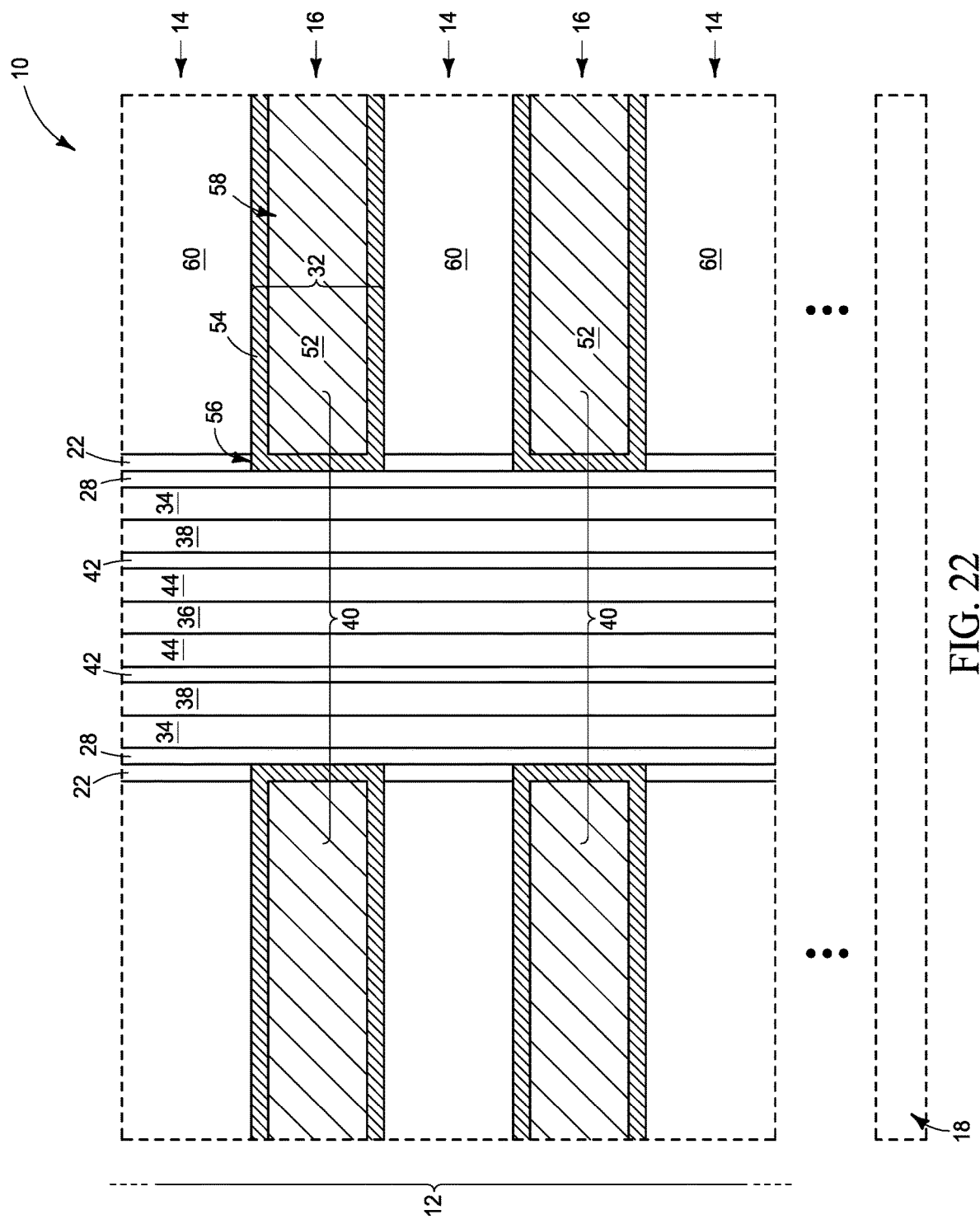

Referring to FIG. 22, the assembly 10 is shown at a processing stage subsequent to that of FIG. 21, and analogous to that described above with reference to FIG. 13. Specifically, the conductive materials 52 and 54 are formed within the voids 30 (FIG. 21).

Figure 23:
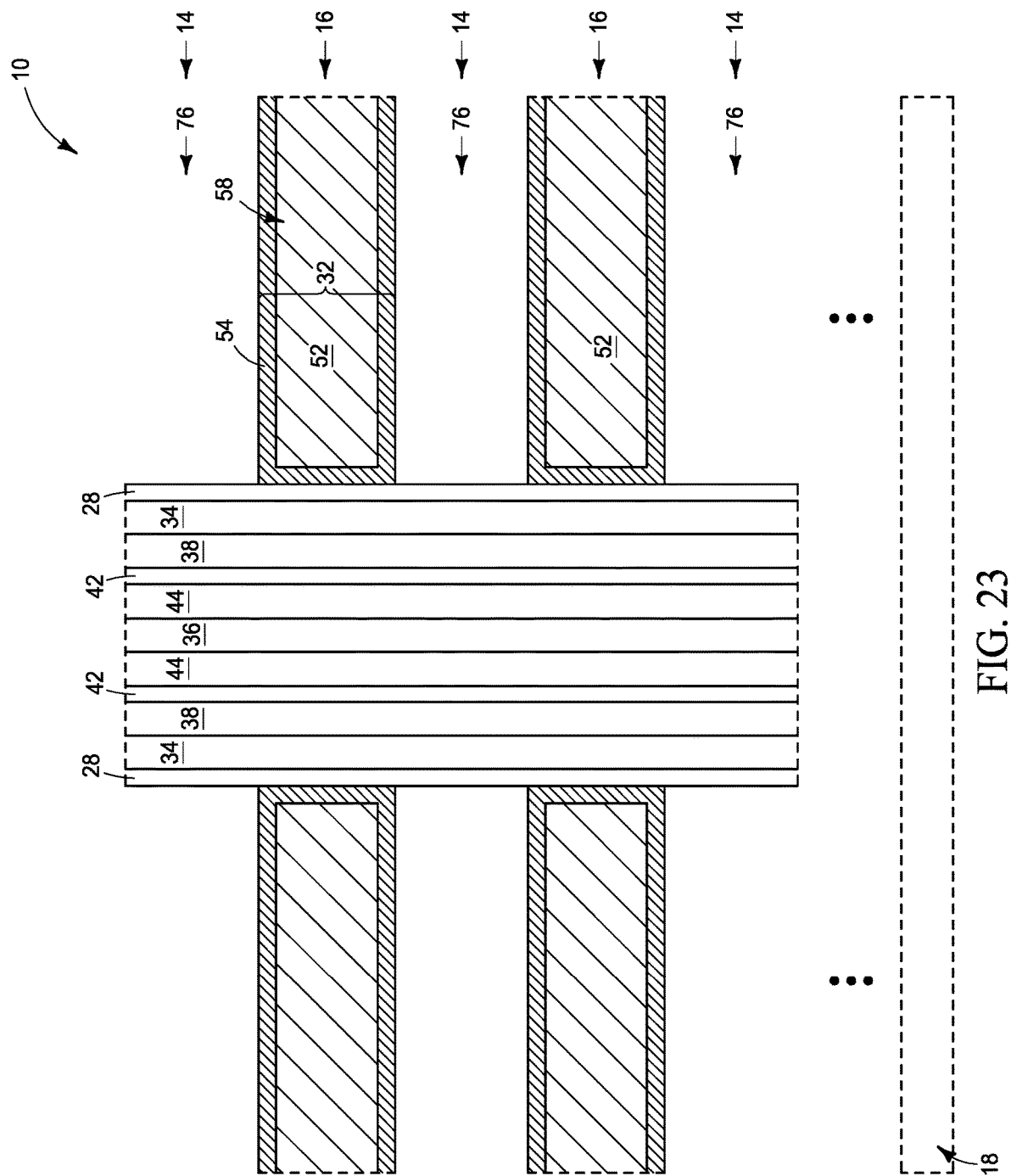

The configuration of FIG. 22 may be a final structure of a memory arrangement (e.g., an assembly configured to include NAND memory). Alternatively, the configuration of FIG. 22 may be subjected to further processing to form a memory arrangement. For instance, FIG. 23 shows a process stage which may follow that of FIG. 22. The materials 60 and 22 have been removed from the levels 14 with suitable etching, which leaves voids 76 along the levels 14.

Figure 24:
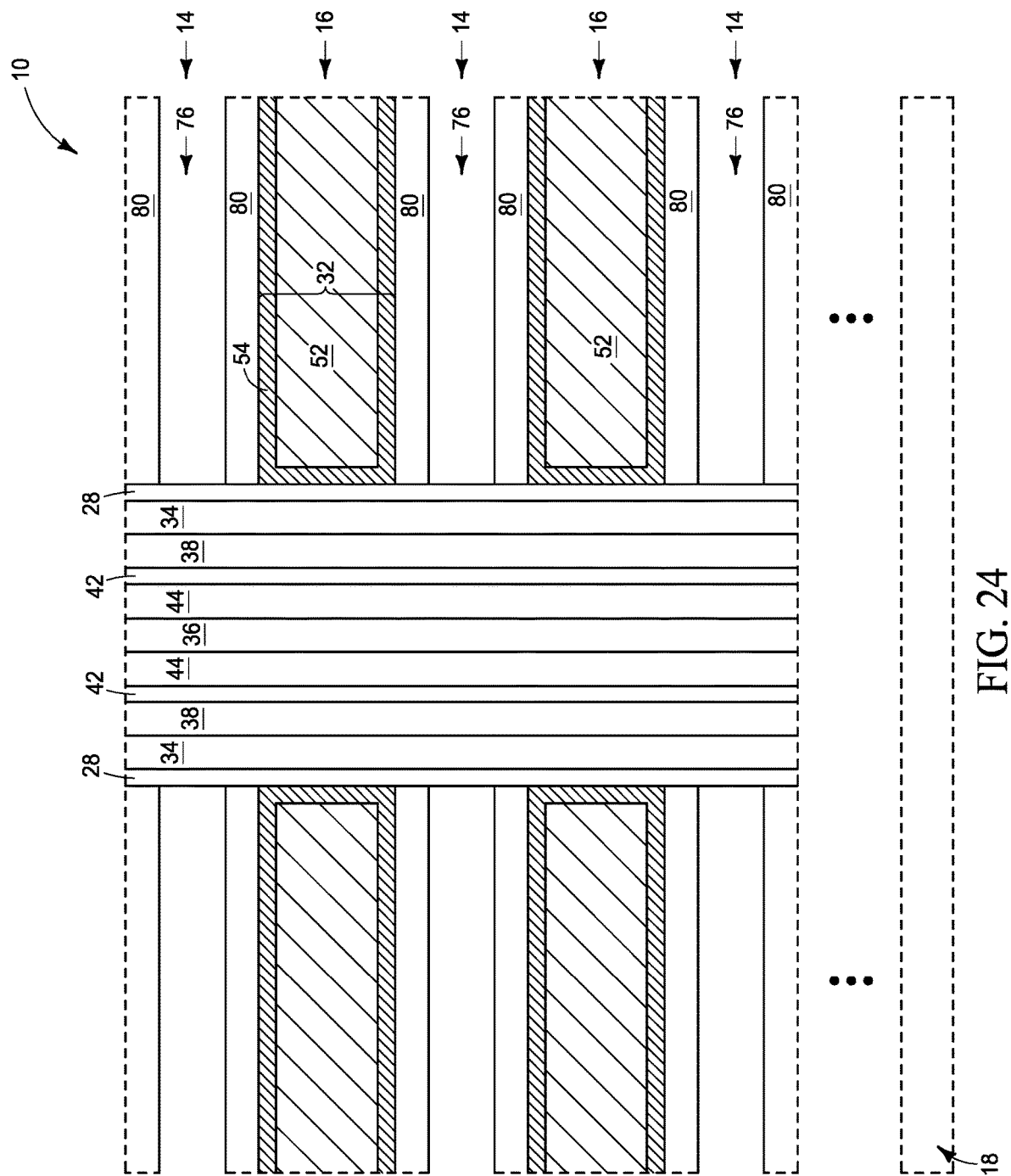

Referring to FIG. 24, the sacrificial material 80 is formed within the voids 76 to narrow the voids utilizing processing analogous to that described above with reference to FIG. 17.

Figure 25:
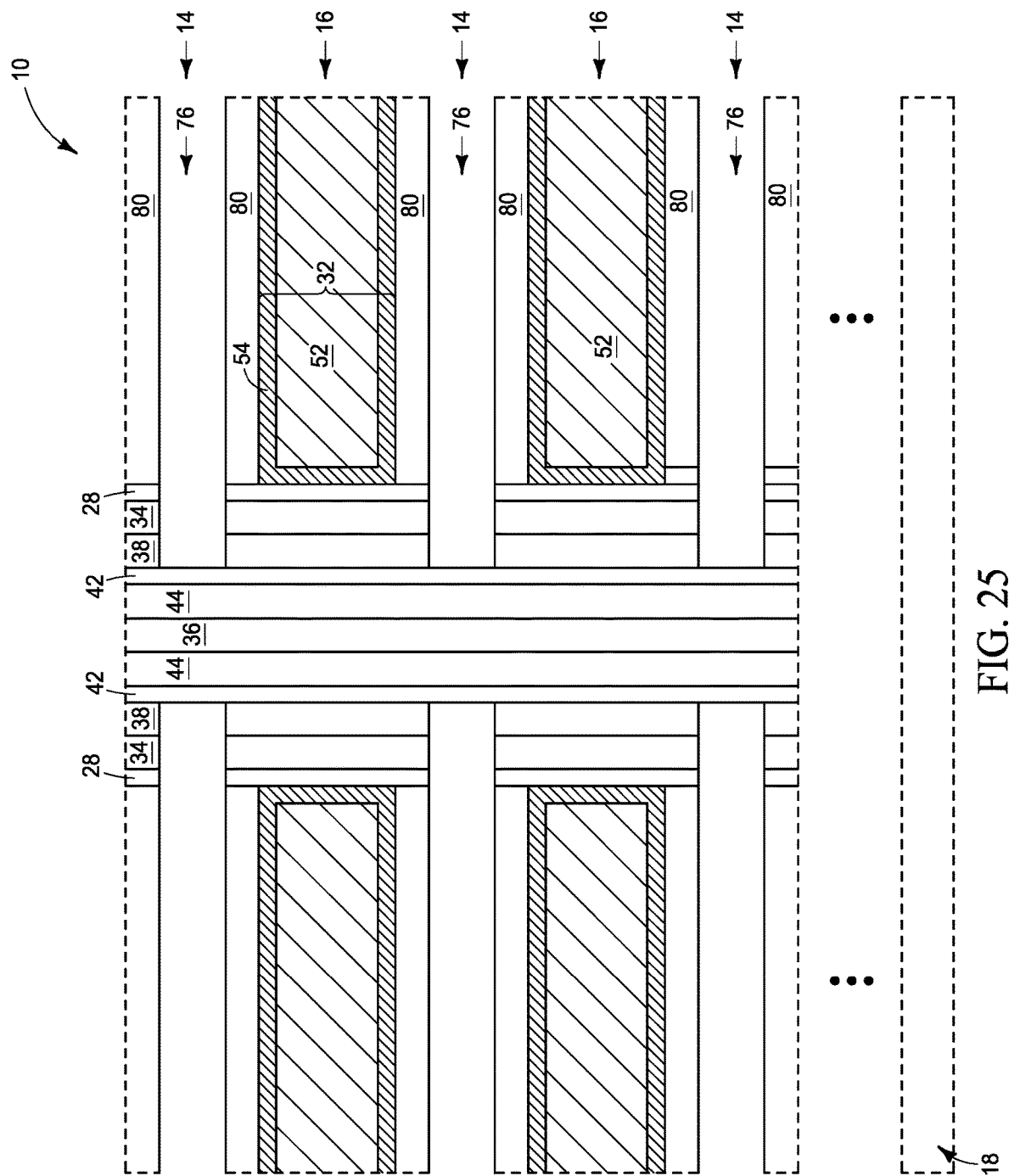

Referring to FIG. 25, the narrowed voids 76 are extended through the dielectric-barrier material 28, the charge-blocking material 34, and the charge-storage material 38 with processing analogous to that described above with purpose to FIG. 18.

Figure 26:
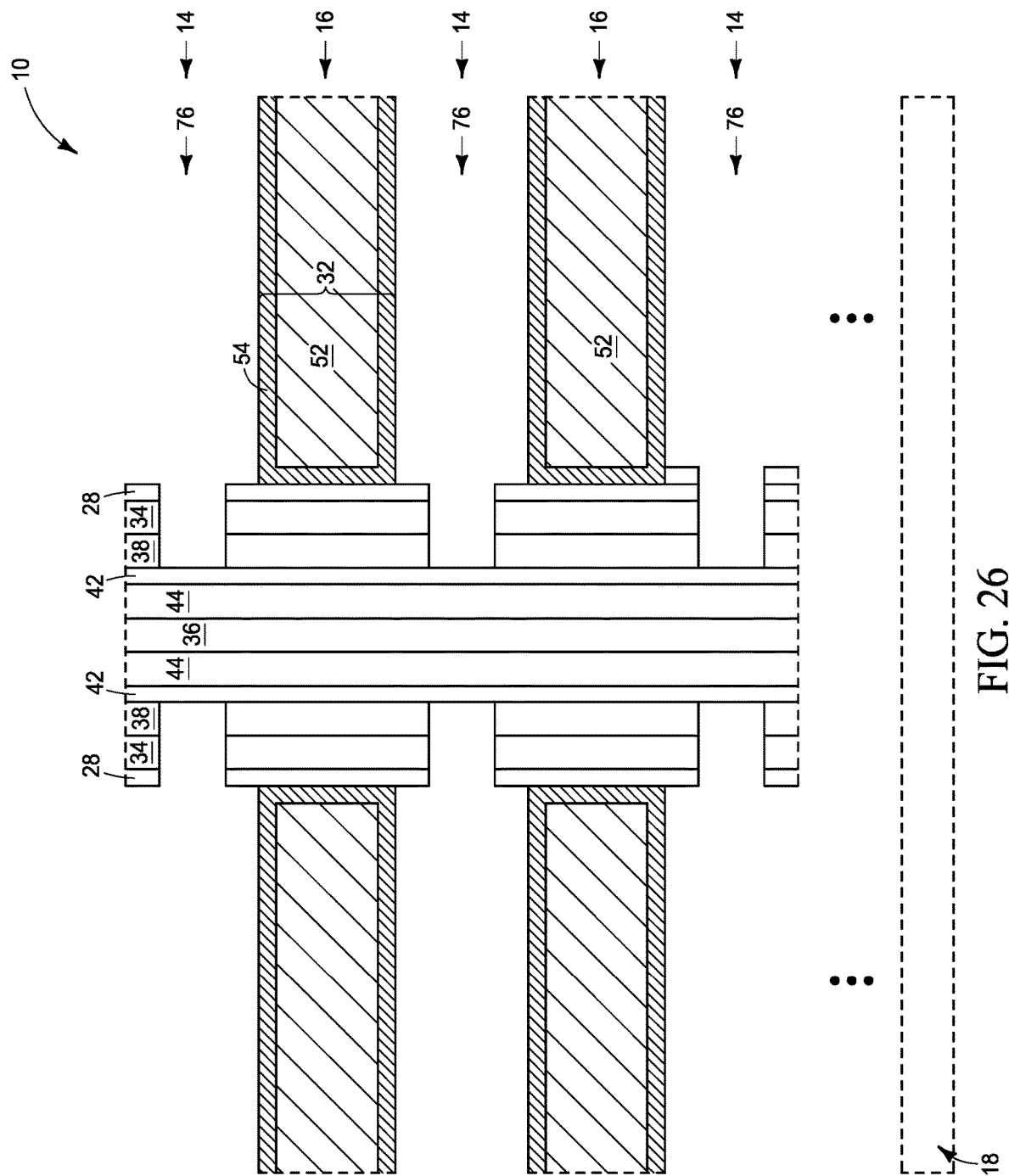

Referring to FIG. 26, the sacrificial material 80 (FIG. 25) is removed with processing analogous to that described above with reference to FIG. 19.

Figure 27:
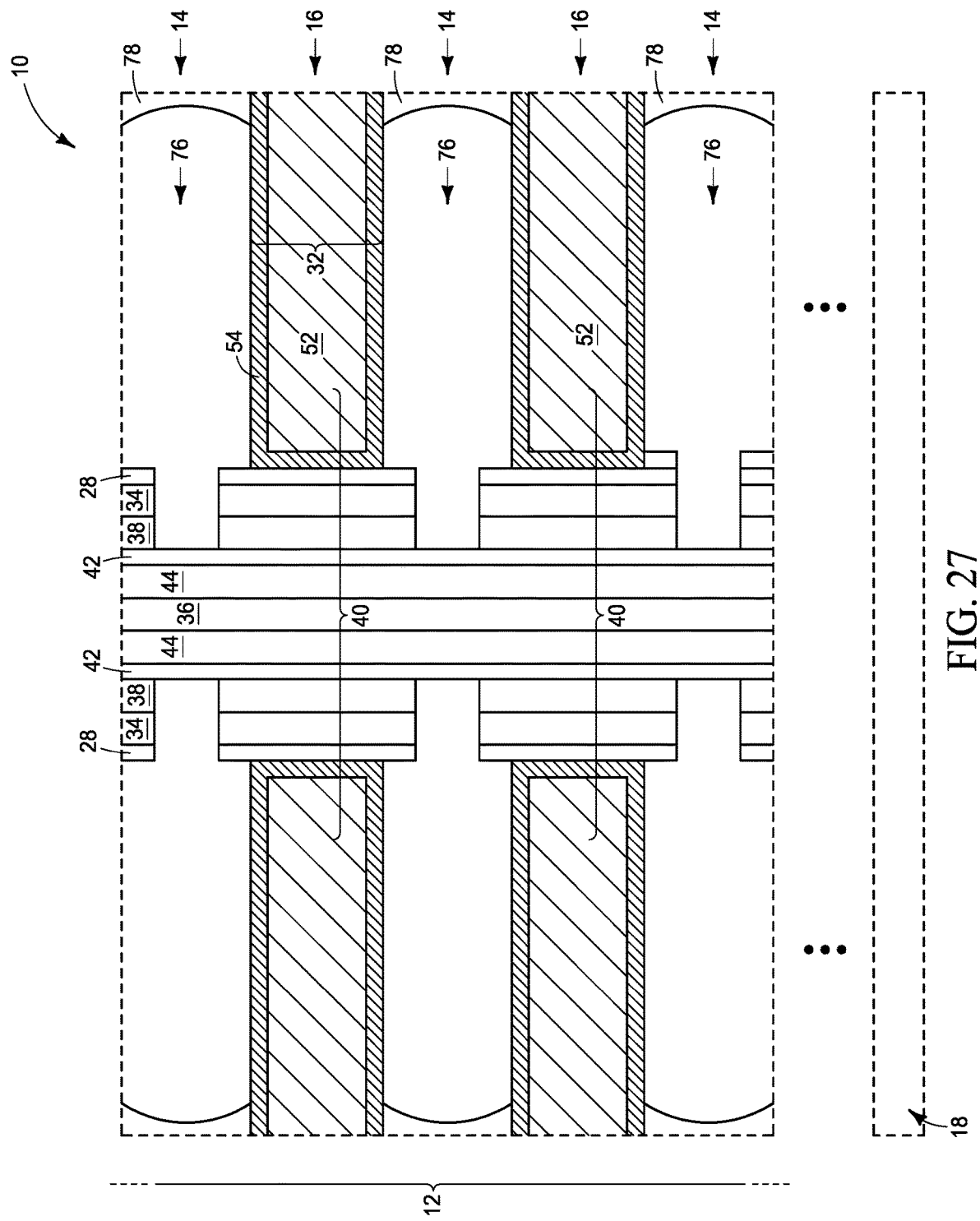

Referring to FIG. 27, ends of the voids 76 are capped with the insulative material 78 with processing analogous to that described above with reference to FIG. 14A to form a final assembly (e.g., a NAND memory assembly).

Figure 28:
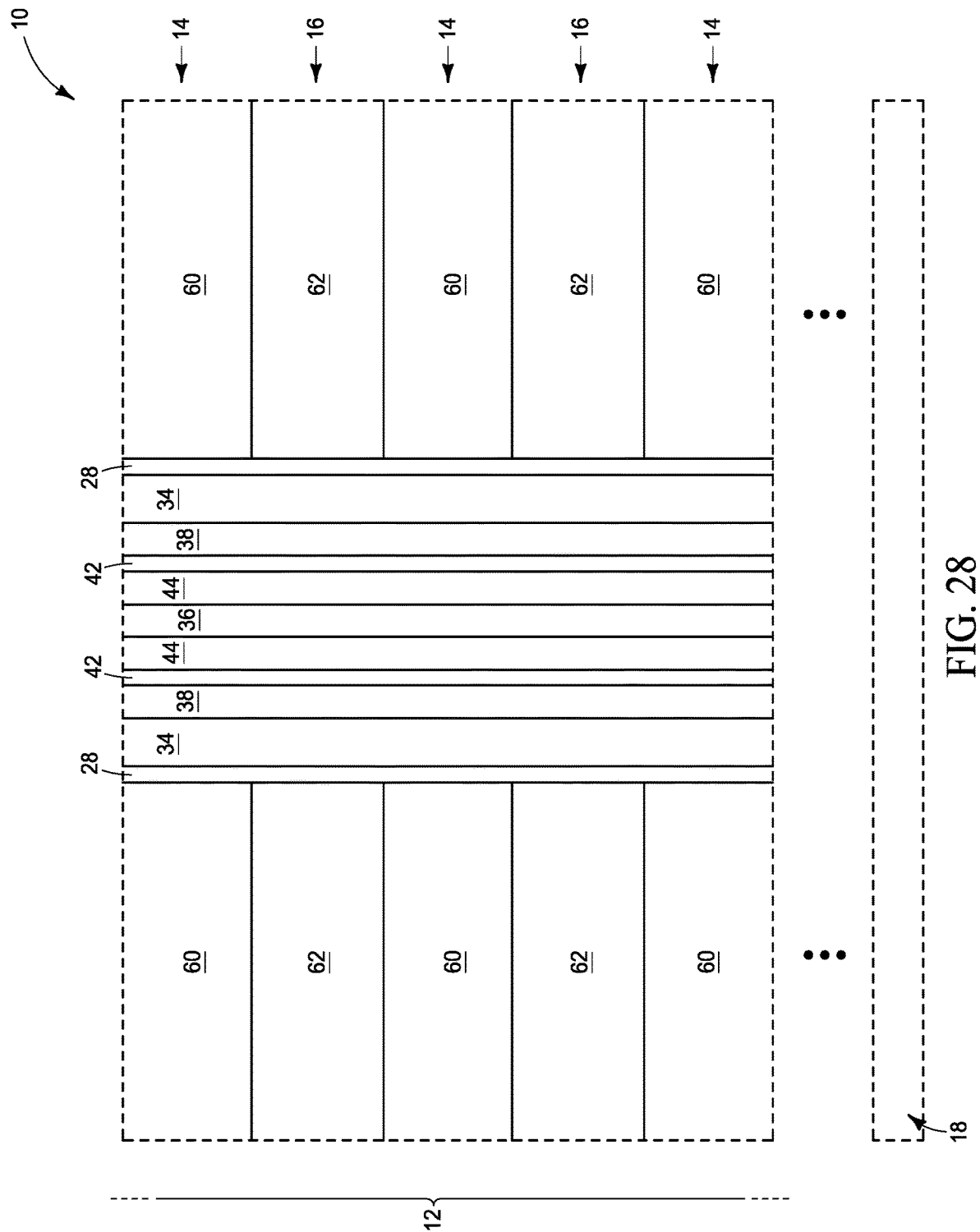
FIGS. 28-35 are diagrammatic cross-sectional side views of the region of the integrated assembly of FIG. 5 shown at example sequential process stages of an example method for forming an example NAND memory array. The process stage of FIG. 28 may follow that of FIG. 6.

In some embodiments, the liner material 22 (FIG. 9) may be omitted. For instance, FIG. 28 shows an assembly 10 analogous to that of FIG. 9, but lacking the liner material 22. The process stage of FIG. 28 may follow that of FIG. 6.

Figure 29:
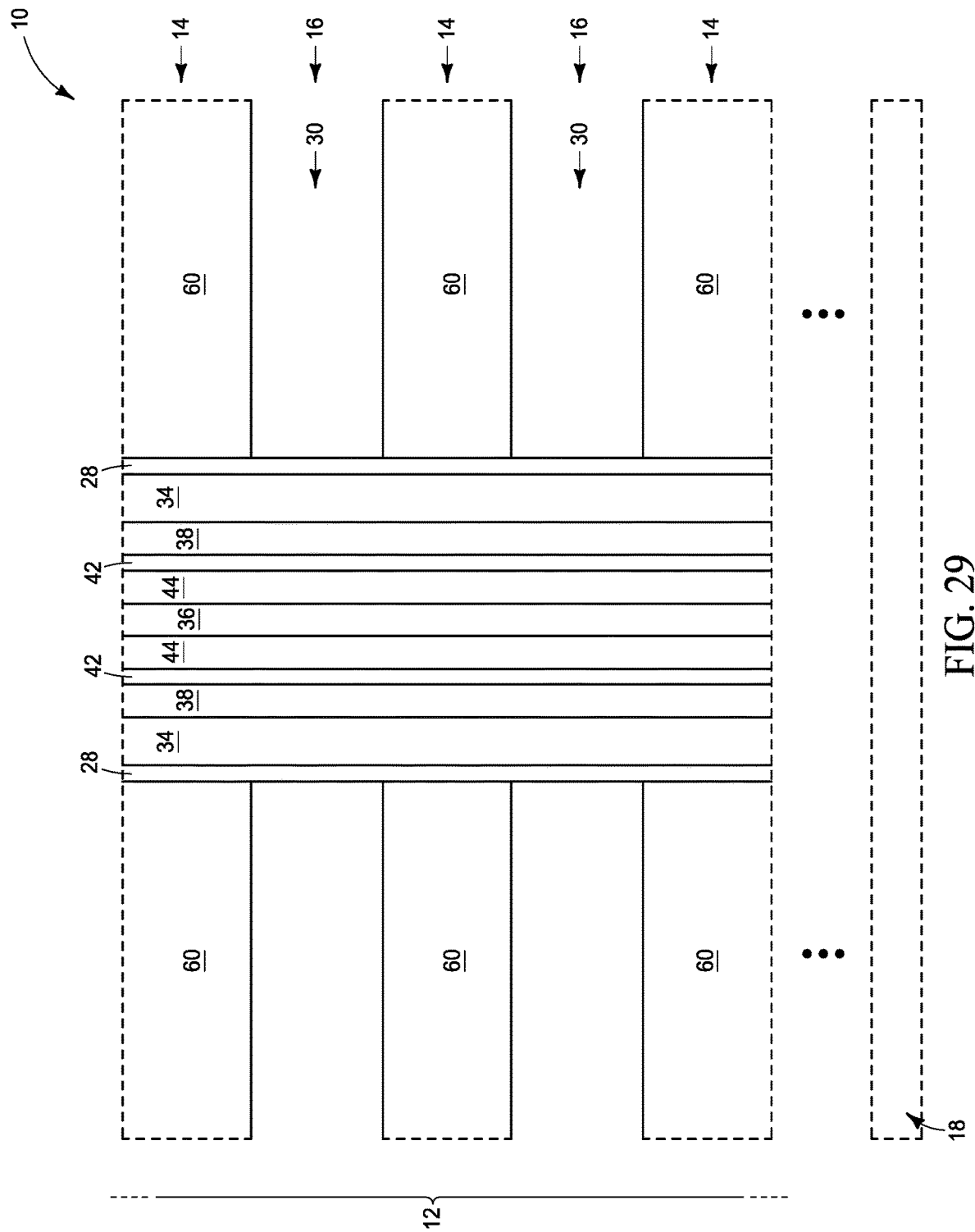

Referring to FIG. 29, the sacrificial material 62 (FIG. 28) is removed to leave voids 30 along the levels 16.

Figure 30:
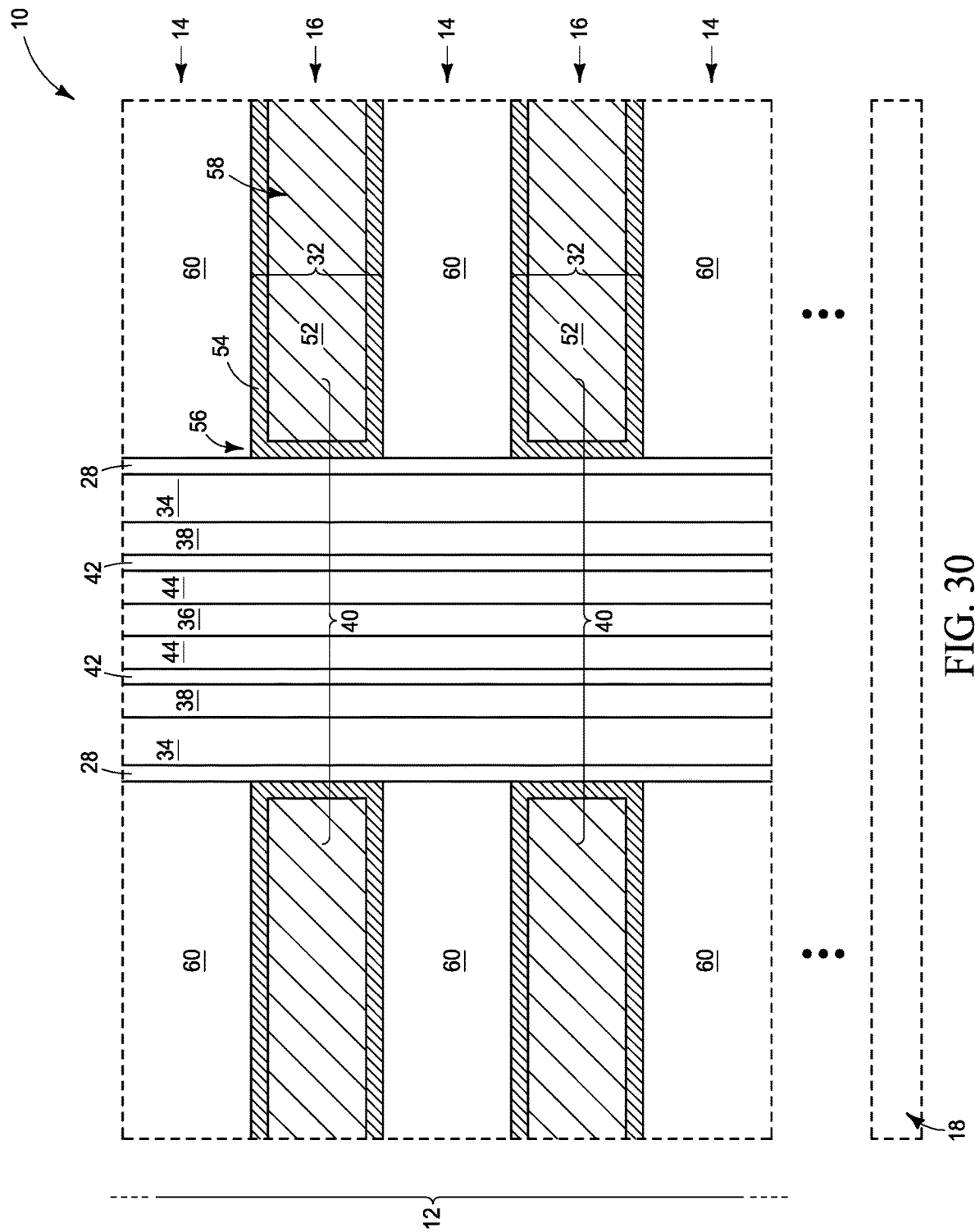

Referring to FIG. 30, the conductive materials 52 and 54 are formed within the voids 30 (FIG. 29).

Figure 31:
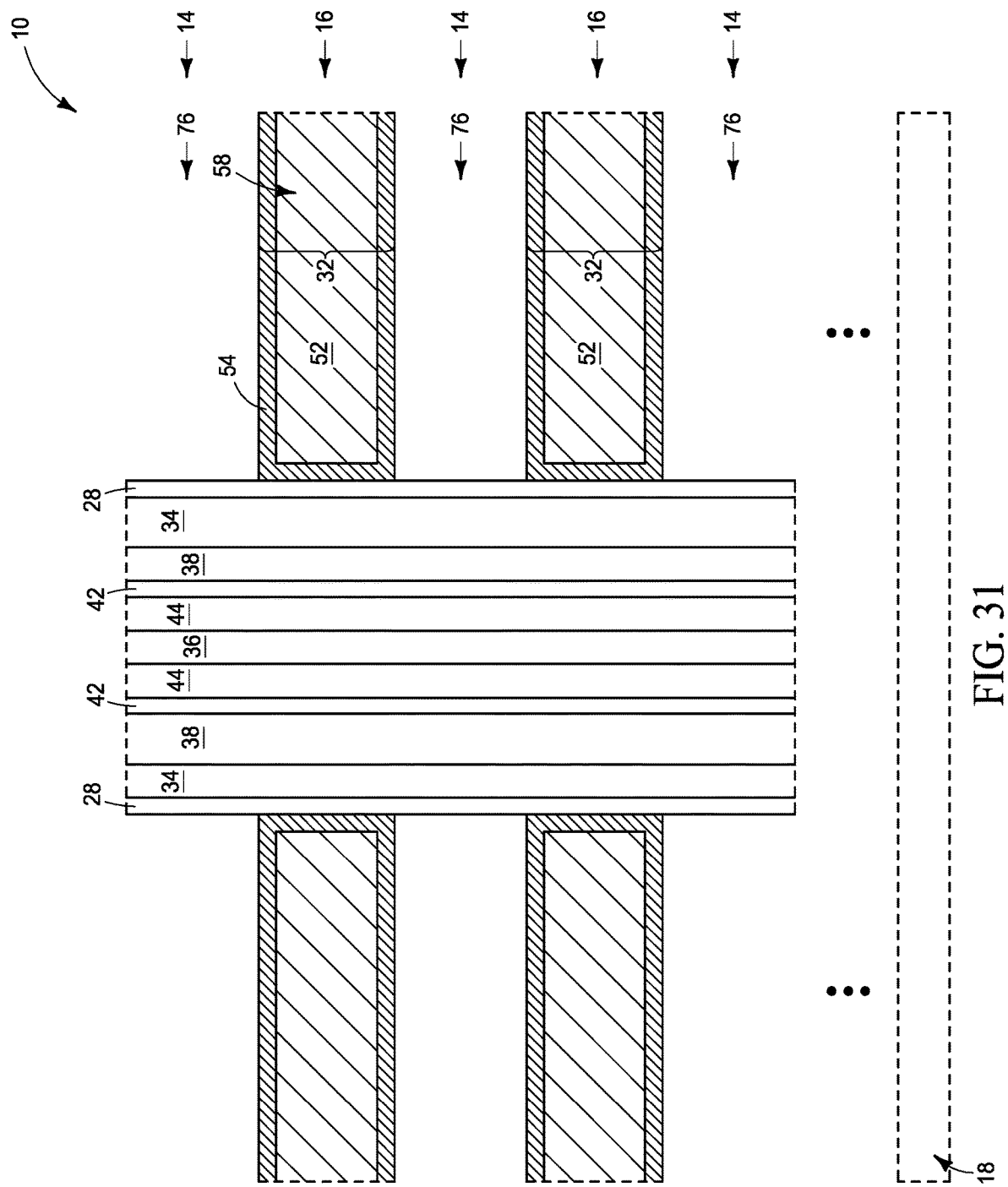

The configuration of FIG. 30 may be a final structure of a memory arrangement (e.g., an assembly configured to include NAND memory). Alternatively, the configuration of FIG. 30 may be subjected to further processing to form a memory arrangement. For instance, FIG. 31 shows a process stage which may follow that of FIG. 30. The material 60 has been removed from the levels 14 with suitable etching, which leaves voids 76 along the levels 14.

Figure 32:
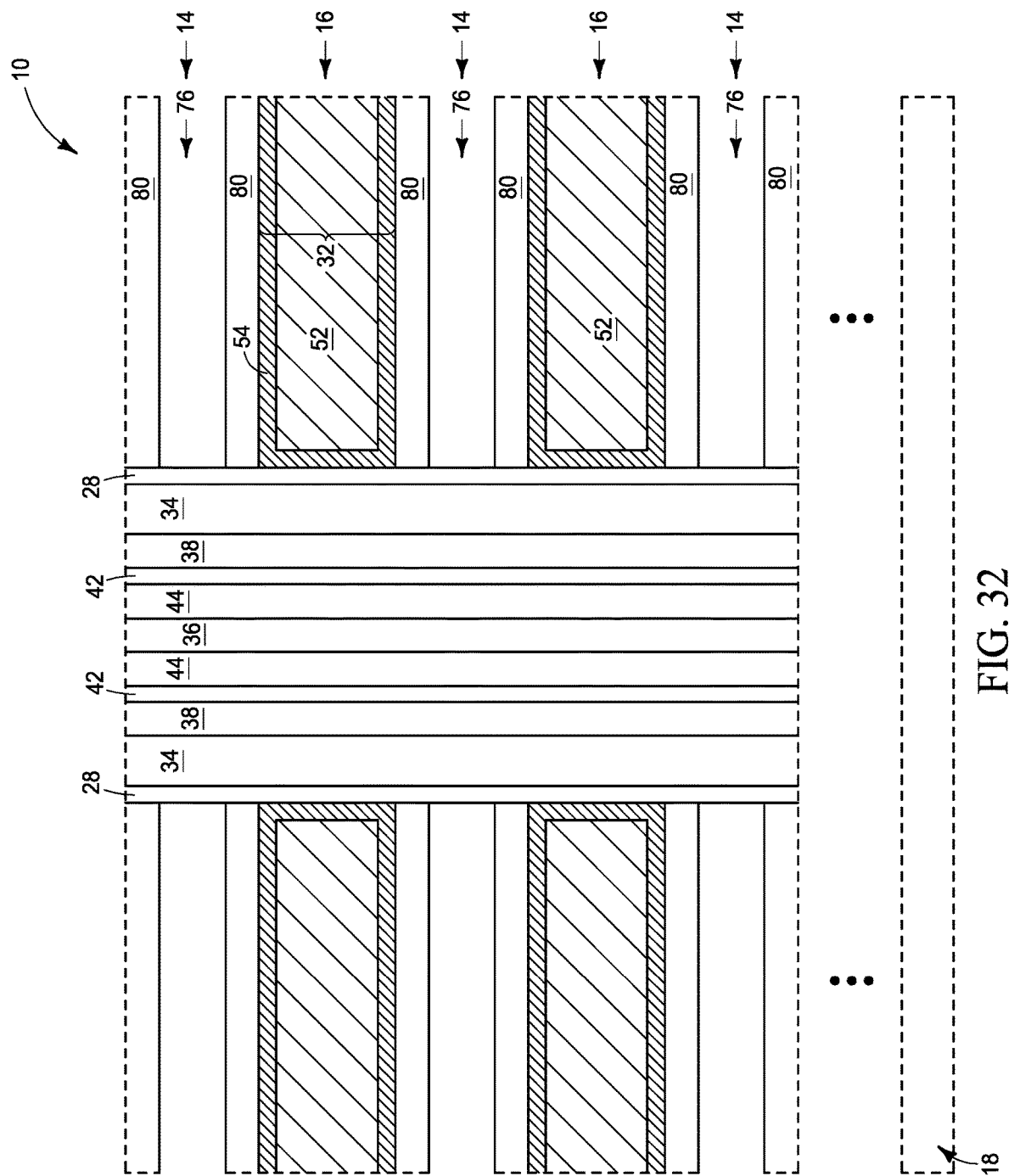

Referring to FIG. 32, the sacrificial material 80 is formed within the voids 76 to narrow the voids utilizing processing analogous to that described above with reference to FIG. 17.

Figure 33:
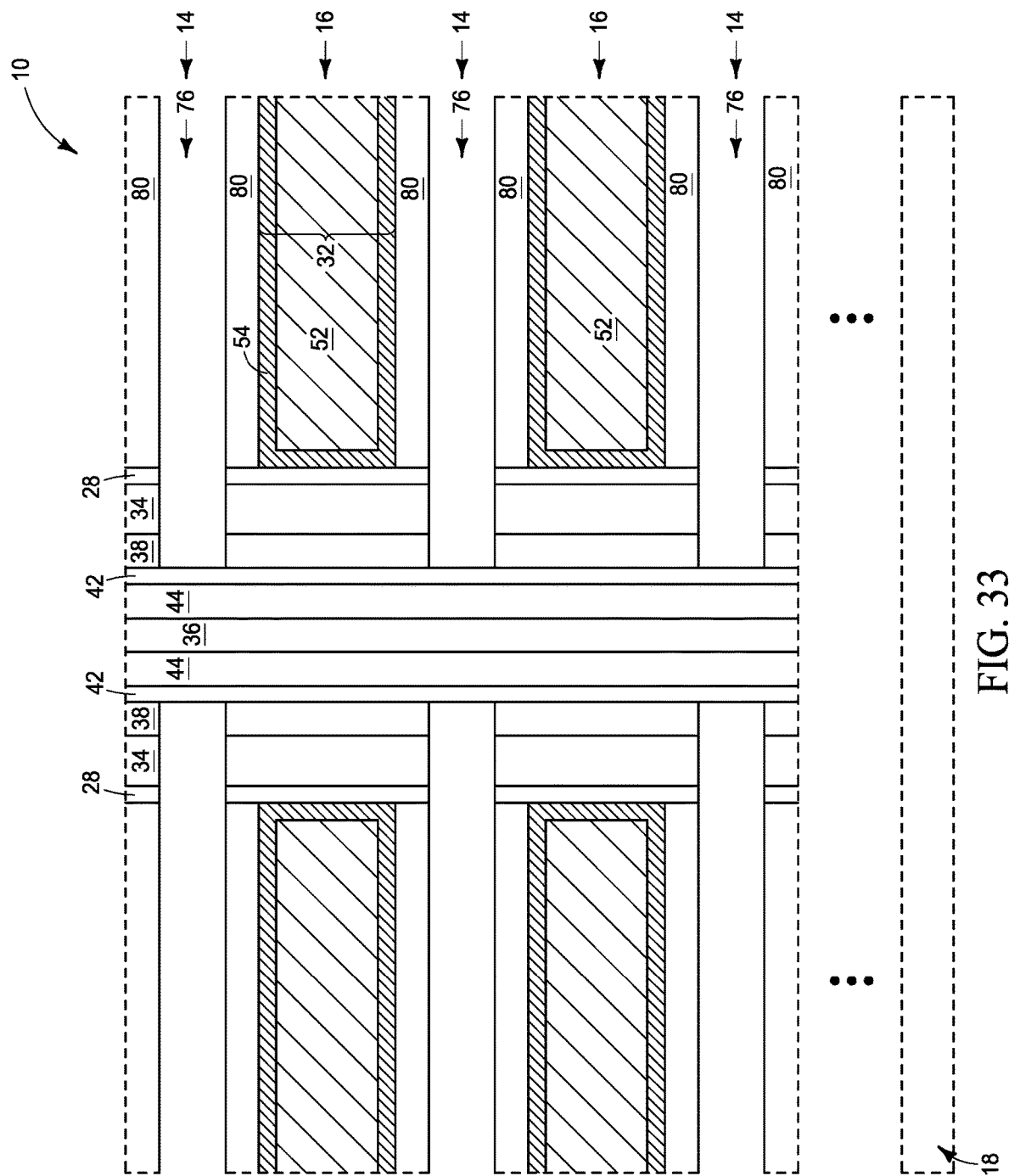

Referring to FIG. 33, the narrowed voids 76 are extended through the dielectric-barrier material 28, the charge-blocking material 34, and the charge-storage material 38 with processing analogous to that described above with purpose to FIG. 18.

Figure 34:
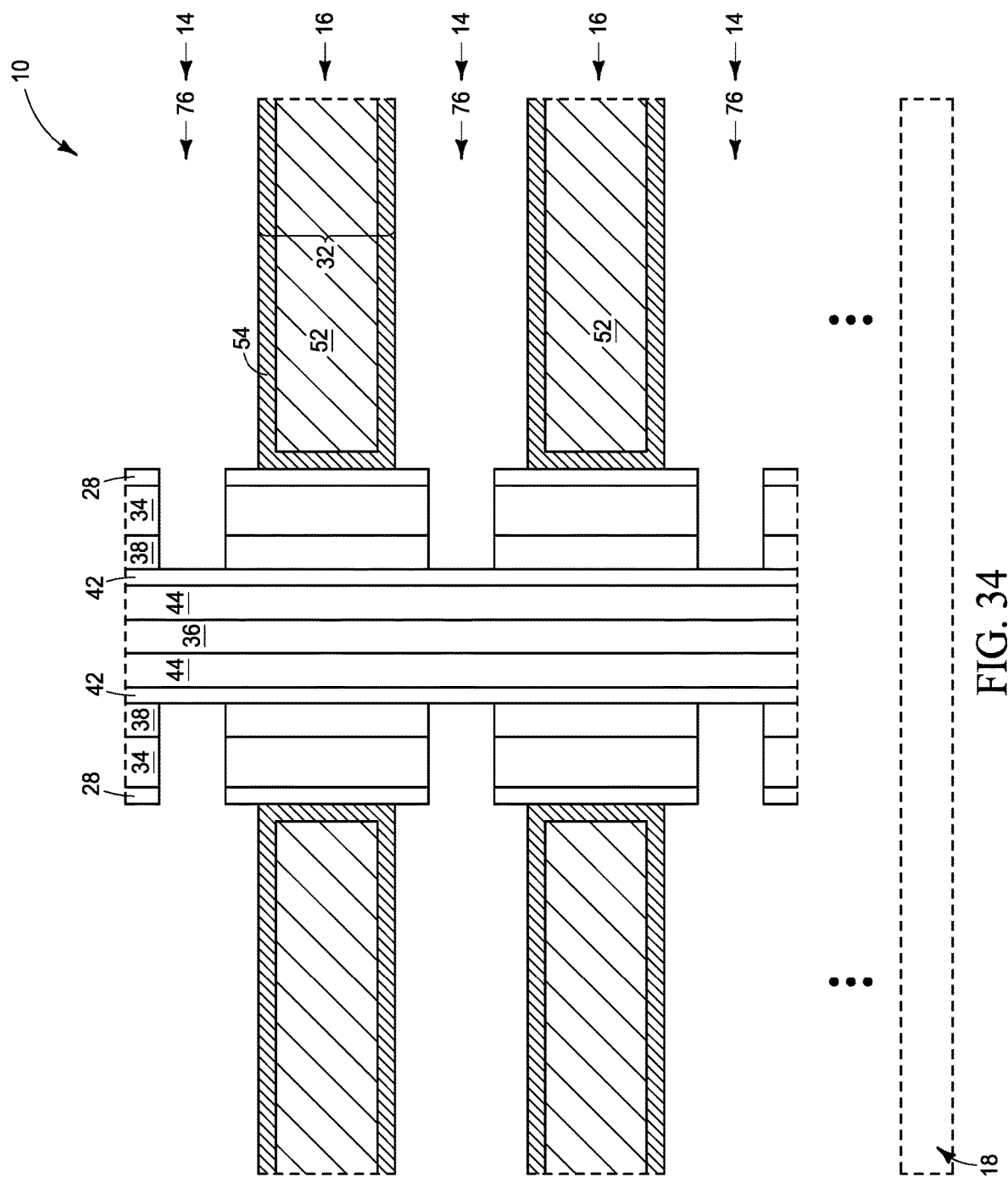

Referring to FIG. 34, the sacrificial material 80 (FIG. 33) is removed with processing analogous to that described above with reference to FIG. 19.

Figure 35:
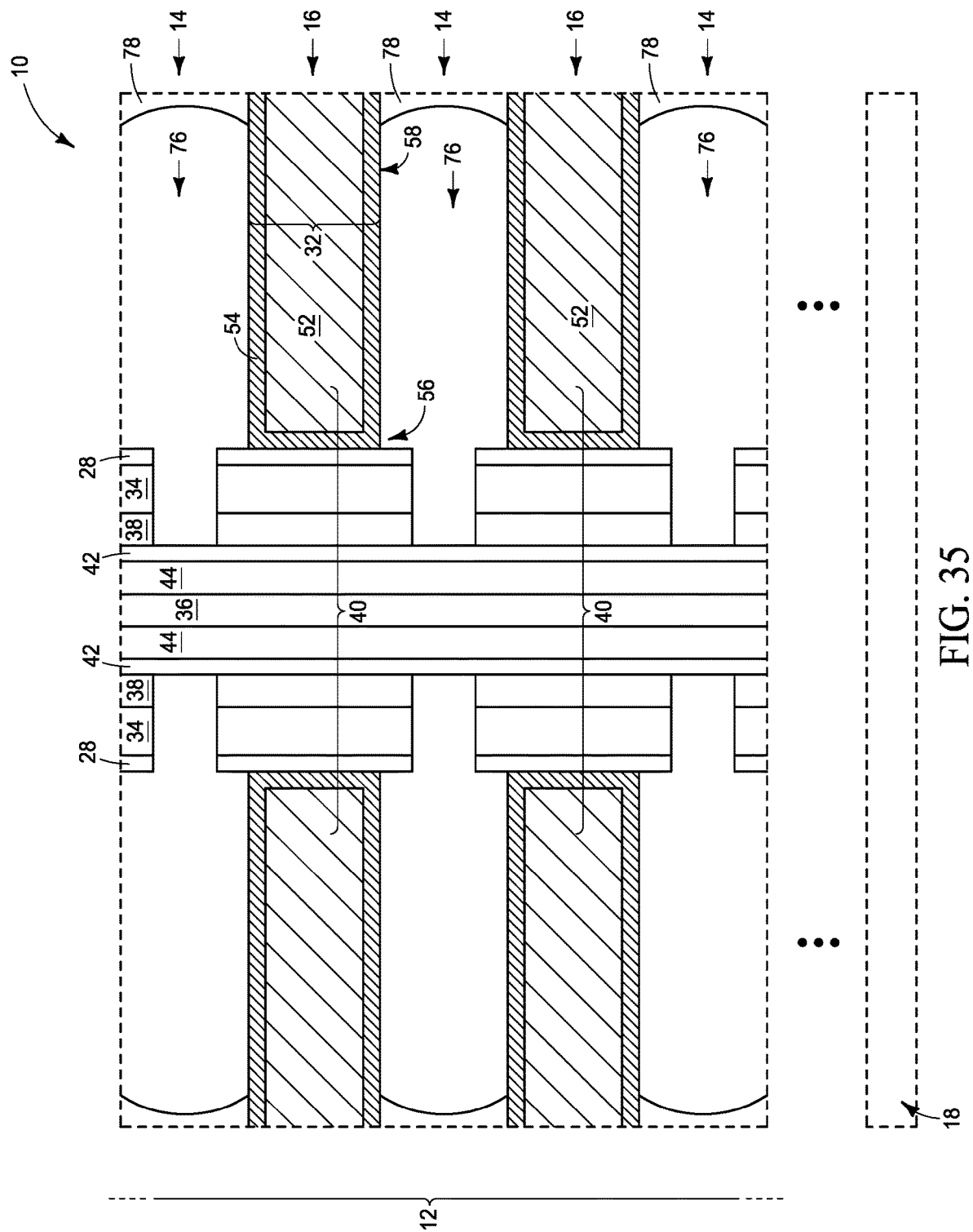

Referring to FIG. 35, ends of the voids 76 are capped with the insulative material 78 with processing analogous to that described above with reference to FIG. 14A to form a final assembly (e.g., a NAND memory assembly).

Figure 36:
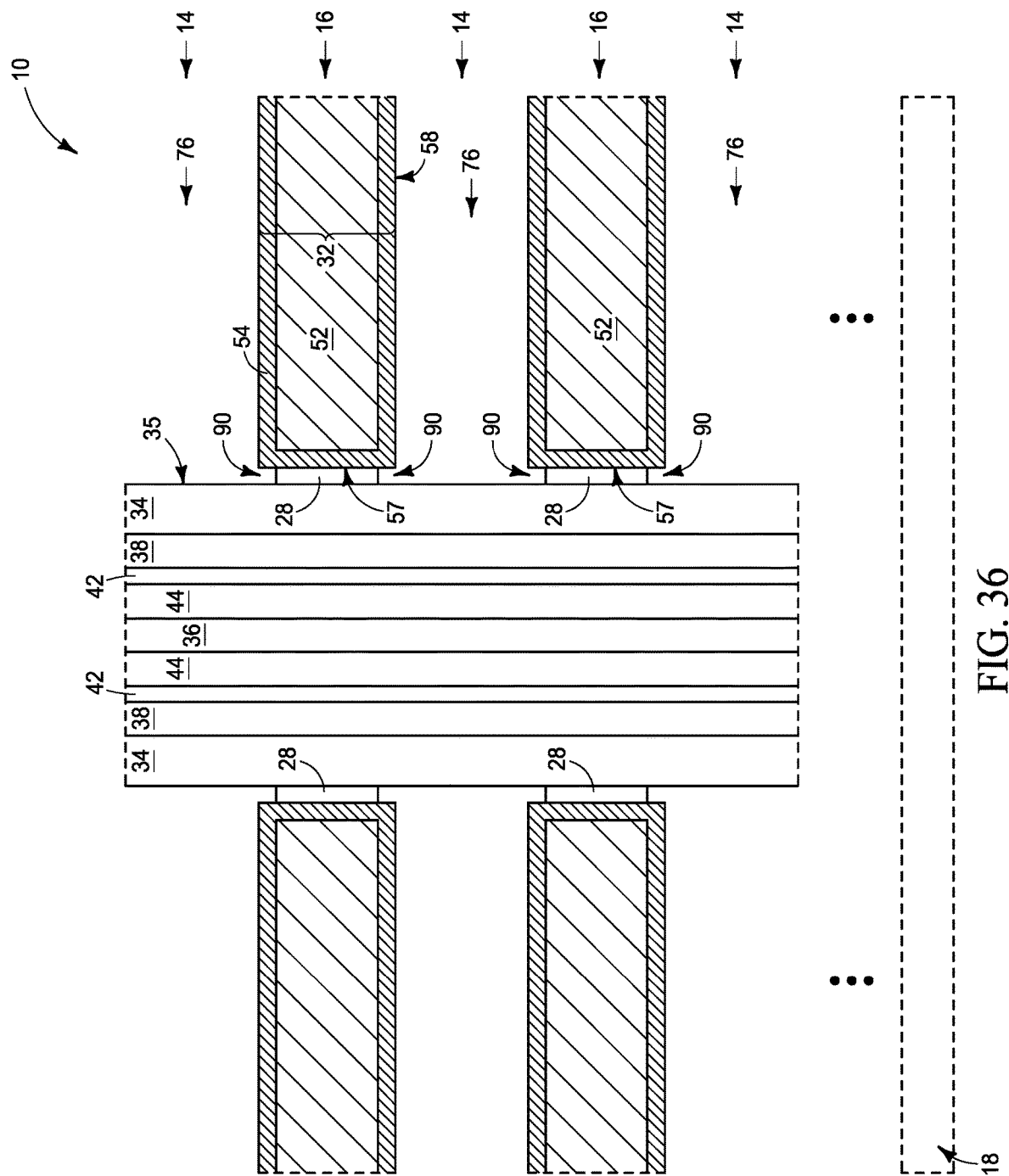
FIGS. 36-40 are diagrammatic cross-sectional side views of the region of the integrated assembly of FIG. 5 shown at example sequential process stages of an example method for forming an example NAND memory array. The process stage of FIG. 36 may follow that of FIG. 31.

The processing of FIG. 32 shows the sacrificial material 80 formed within the voids 76 prior to an etch through the dielectric-barrier material 28. In other embodiments, the dielectric-barrier material 28 may be etched prior to forming the sacrificial material 80 within the voids 76. For instance, FIG. 36 shows a processing stage which may follow that of FIG. 31, and shows the dielectric-barrier material 28 etched to expose a surface 35 of the charge-blocking material 34. In the illustrated embodiment, the etching of the dielectric-barrier material recesses such material relative to the front faces (front surfaces) 57 of the conductive levels 16 to leave cavities 90. In other embodiments the dielectric-barrier material may not be recessed relative to the front faces 57, and accordingly the cavities 90 may not be formed.

Figure 37:
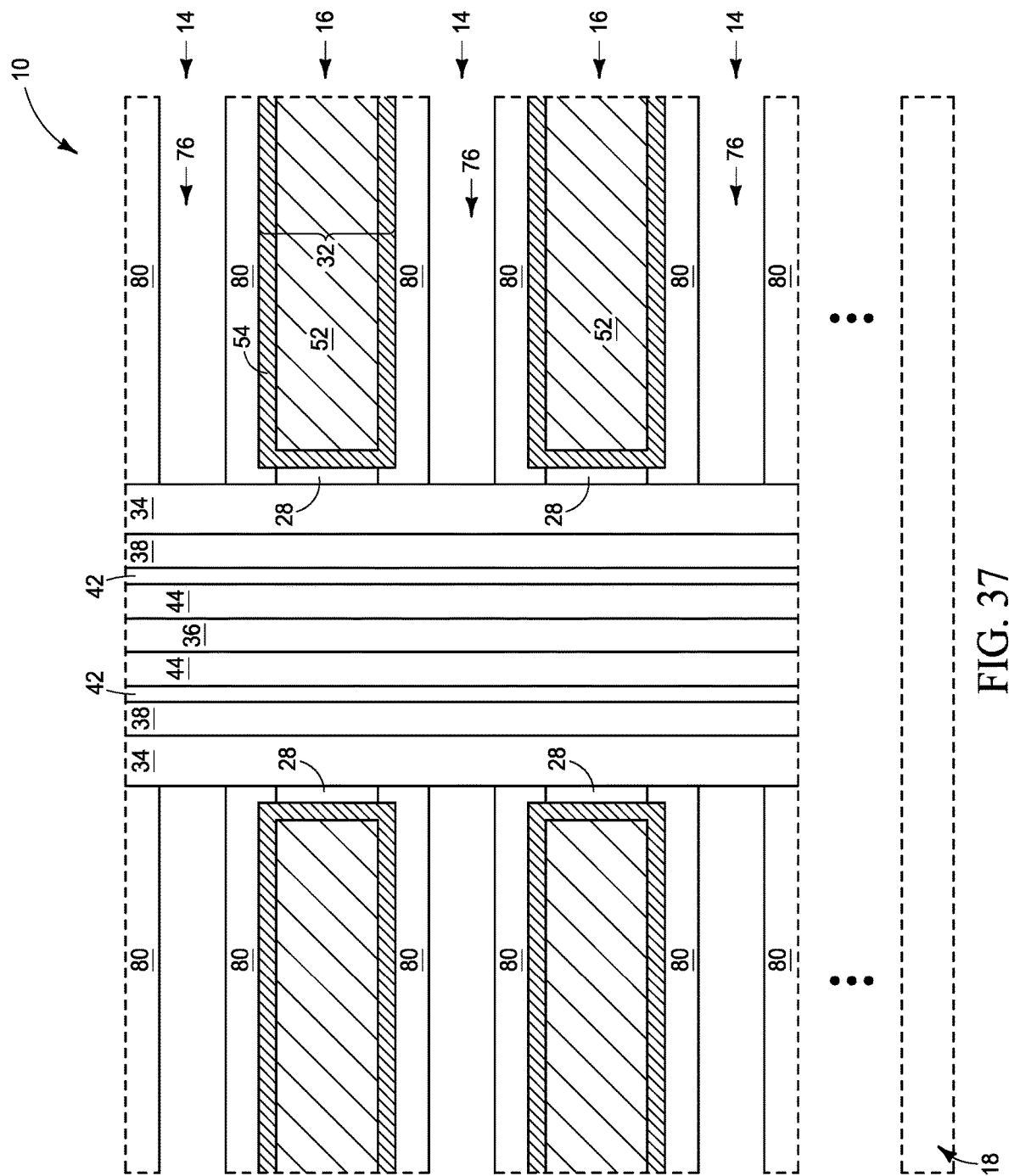

Referring to FIG. 37, the sacrificial material 80 is formed within the voids 76 to narrow the voids utilizing processing analogous to that described above with reference to FIG. 17.

Figure 38:
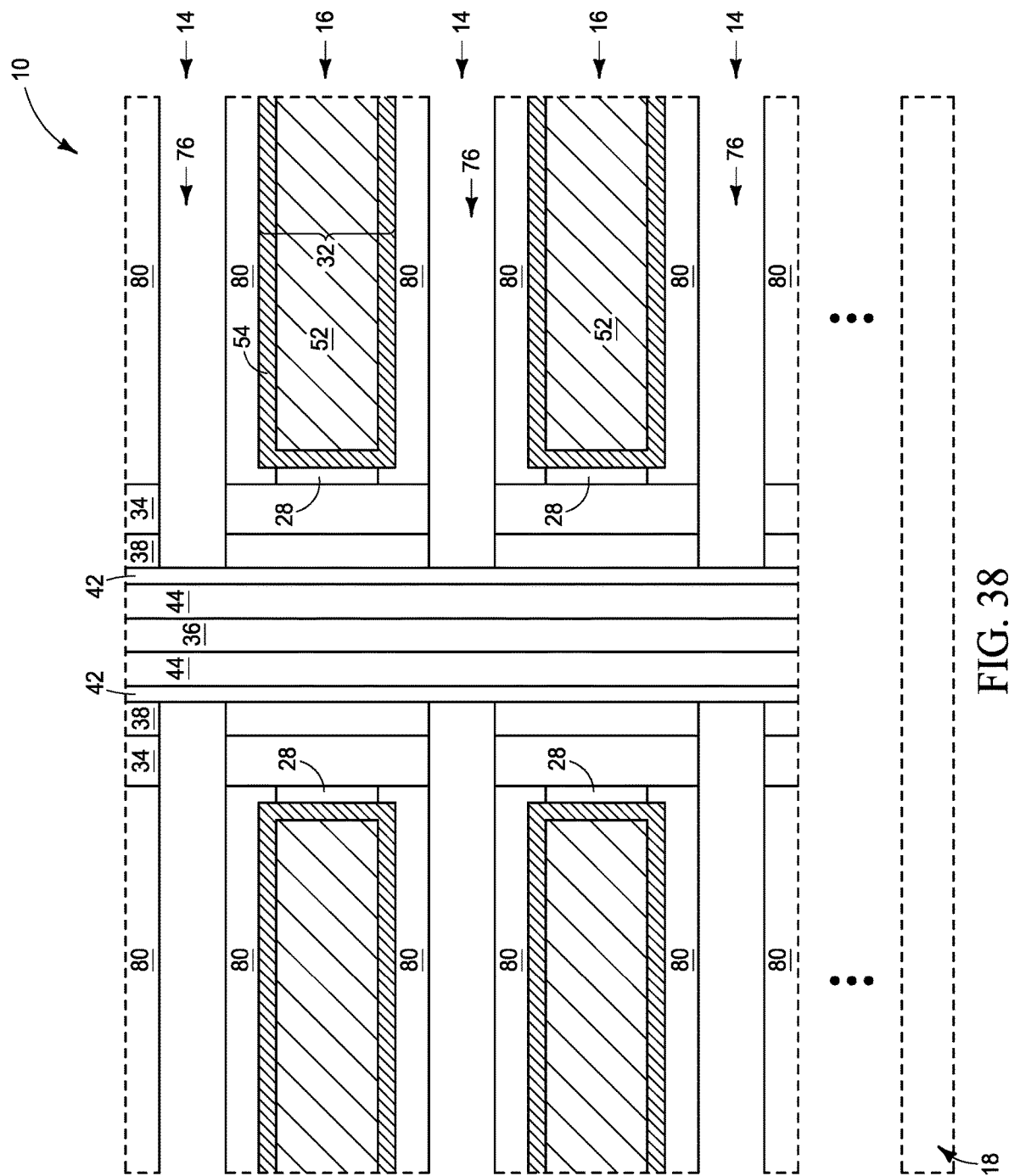

Referring to FIG. 38, the narrowed voids 76 are extended through the charge-blocking material 34 and the charge-storage material 38 with processing analogous to that described above with purpose to FIG. 18.

Figure 39:
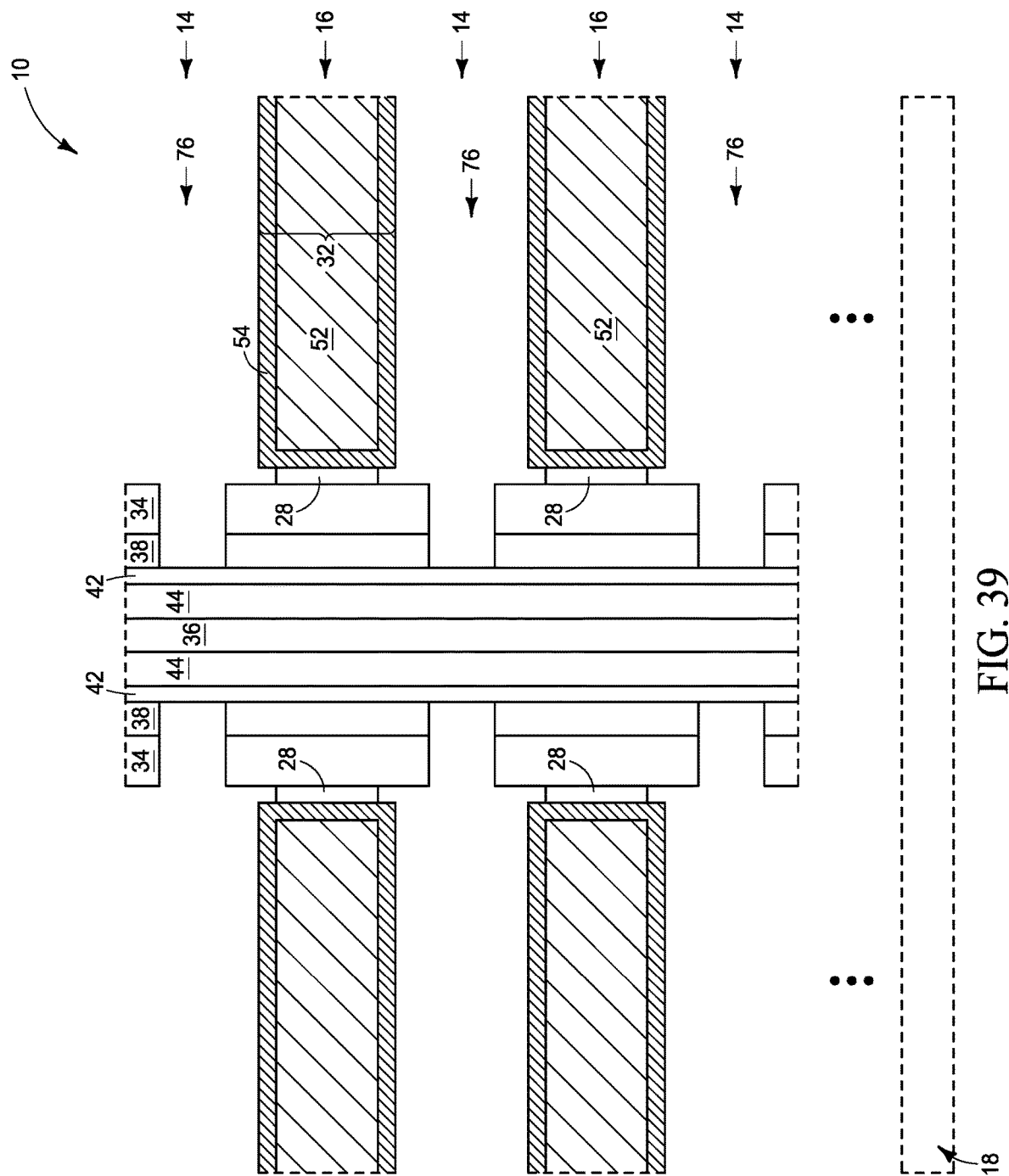

Referring to FIG. 39, the sacrificial material 80 (FIG. 38) is removed with processing analogous to that described above with reference to FIG. 19.

Figure 40:
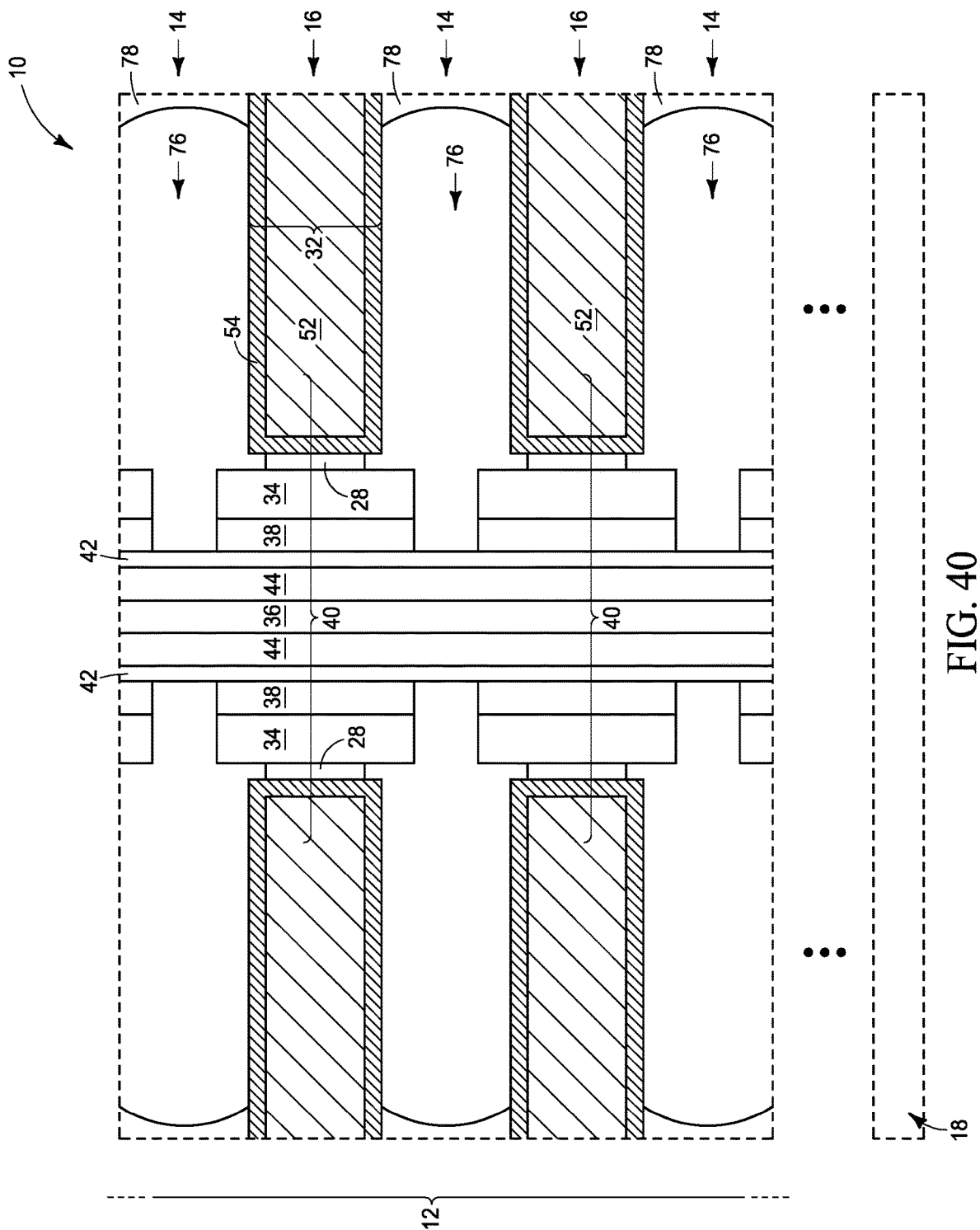

Referring to FIG. 40, ends of the voids 76 are capped with the insulative material 78 with processing analogous to that described above with reference to FIG. 14A to form a final assembly (e.g., a NAND memory assembly).

In operation, the charge-storage material 38 may be configured to store information in the memory cells 40 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 72 (with example gates 72 being labeled in FIG. 13), and/or based on the value of voltage applied to the channel material 44.

The tunneling material 42 forms tunneling regions of the memory cells 40. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 may provide a mechanism to block charge from flowing from the charge-storage material 38 to the associated gates 72.

The dielectric-barrier material (high-k material) 28 may be utilized to inhibit back-tunneling of charge carriers from the gates 72 toward the charge-storage material 38. In some embodiments, the dielectric-barrier material 28 may be considered to form dielectric-barrier regions within the memory cells 40.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a vertical stack of alternating insulative levels and conductive levels. The conductive levels have terminal regions, and have nonterminal regions proximate the terminal regions. The terminal regions are vertically thicker than the nonterminal regions. Channel material extends vertically through the stack. Tunneling material is adjacent the channel material. Charge-storage material is adjacent the tunneling material. High-k dielectric material is between the charge-storage material and the terminal regions of the conductive levels. The insulative levels have first regions vertically between the terminal regions of neighboring conductive levels, and have second regions vertically between the nonterminal regions of the neighboring conductive levels. The first regions of the insulative levels contain carbon.

Some embodiments include an integrated assembly comprising a vertical stack of alternating insulative levels and conductive levels. The conductive levels have terminal regions, and have nonterminal regions proximate the terminal regions. The terminal regions are vertically thicker than the nonterminal regions. The conductive levels comprise a conductive liner material along an outer periphery of a conductive core material. The conductive liner material is compositionally different from the conductive core material. The terminal regions comprise only the conductive liner material. The nonterminal regions comprise both the conductive liner material and the conductive core material. The conductive liner material has a substantially uniform thickness along the nonterminal and terminal regions of the conductive levels. The terminal regions join to the nonterminal regions at corners having angles of about 90°. The nonterminal regions are substantially vertically-centered relative to the terminal regions along the conductive levels. Channel material extends vertically through the stack. Tunneling material is adjacent the channel material. Charge-storage material is adjacent the tunneling material. Charge-blocking material is adjacent the charge-storage material. High-k dielectric material is between the charge-blocking material and the terminal regions of the conductive levels.

Some embodiments include a method of forming an integrated assembly. A vertical stack of alternating first and second levels is formed. The first levels comprise first material and the second levels comprise second material. An opening is formed to extend through the stack. The opening has a peripheral sidewall. A liner is formed along the peripheral sidewall. The liner is a carbon-containing material. The liner has first regions along the first levels and has second regions along the second levels. Dielectric-barrier material is formed adjacent the liner. Charge-blocking material is formed adjacent the dielectric-barrier material. Charge-storage material is formed adjacent the charge-blocking material. Tunneling material is formed adjacent the charge-storage material. Channel material is formed adjacent the tunneling material. The second material is removed to leave voids between the first levels, and to expose the second regions of the liner. The exposed second regions of the liner are oxidized to form oxidized segments of the liner. The oxidized segments of the liner are first segments of the liner. The first segments of the liner vertically alternate with second segments of the liner. The first segments of the liner are removed to expose regions of the dielectric-barrier material. Conductive levels are formed within the voids. The conductive levels have front ends with front surfaces along and directly against the exposed regions of the dielectric-barrier material.

Some embodiments include a method of forming an integrated assembly. A vertical stack of alternating first and second levels is formed. The first levels comprise first material and the second levels comprise second material. An opening is formed to extend through the stack. The opening has a peripheral sidewall. Dielectric-barrier material is formed adjacent the peripheral sidewall. Charge-blocking material is formed adjacent the dielectric-barrier material. Charge-storage material is formed adjacent the charge-blocking material. Tunneling material is formed adjacent the charge-storage material. Channel material is formed adjacent the tunneling material. The second material is removed to leave first voids between the first levels. Conductive levels are formed within the first voids. The conductive levels have front ends with front surfaces. The front surfaces are along and directly against the dielectric-barrier material. The first material is removed to leave second voids. The second voids are lined with sacrificial material to narrow the second voids. The narrowed second voids are extended through the dielectric-barrier material, the charge-blocking material and the charge-storage material. The sacrificial material is removed.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a vertical stack of alternating first and second levels; the first levels comprising first material and the second levels comprising second material;
    forming an opening to extend through the stack, the opening having a peripheral sidewall;
    forming a liner along the peripheral sidewall; the liner being a carbon-containing material; the liner having first regions along the first levels and second regions along the second levels;
    forming dielectric-barrier material adjacent the liner;
    forming charge-blocking material adjacent the dielectric-barrier material;
    forming charge-storage material adjacent the charge-blocking material;
    forming tunneling material adjacent the charge-storage material;
    forming channel material adjacent the tunneling material;
    removing the second material to leave voids between the first levels, and to expose the second regions of the liner;
    oxidizing the exposed second regions of the liner to form oxidized segments of the liner; the oxidized segments of the liner being first segments of the liner; the first segments of the liner vertically alternating with second segments of the liner;
    removing the first segments of the liner to expose regions of the dielectric-barrier material; and
    forming conductive levels within the voids; the conductive levels having front ends with front surfaces along and directly against the exposed regions of the dielectric-barrier material.

2. The method of claim 1 wherein the first segments of the liner have terminal portions which extend beyond the second levels to be along the first levels.

3. The method of claim 2 wherein said terminal portions extend beyond the second levels by at least about 1 nm.

4. The method of claim 1 wherein the carbon-containing material comprises SiOC, where the chemical formula indicates primary constituents rather than a specific stoichiometry; and wherein the carbon is present to a concentration within a range of from about 4 at % to about 20 at %.

5. The method of claim 1 wherein the carbon-containing material comprises SiC, where the chemical formula indicates primary constituents rather than a specific stoichiometry; and wherein the carbon is present to a concentration within a range of from about 4 at % to about 20 at %.

6. The method of claim 1 wherein the carbon-containing material comprises SiCN, where the chemical formula indicates primary constituents rather than a specific stoichiometry; and wherein the carbon is present to a concentration within a range of from about 1 ppm to about 5 at %.

7. The method of claim 1 wherein the first material is silicon dioxide and the second material is silicon nitride.

8. The method of claim 1 wherein the voids are first voids, and further comprising removing the first material to leave second voids.

9. The method of claim 1 wherein the exposed regions of the dielectric-barrier material are first regions of the dielectric-barrier material; wherein the voids are first voids; and further comprising:
    removing the first material to leave second voids, the second voids exposing the second segments of the liner;
    oxidizing the exposed second segments of the liner;
    removing the oxidized second segments of the liner to expose second regions of the dielectric-barrier material;
    lining the second voids with sacrificial material to narrow the second voids;
    extending the narrowed second voids through the second regions of the dielectric-barrier material, through the charge-blocking material and through the charge-storage material; and
    removing the sacrificial material.

10. A method of forming an integrated assembly, comprising:
    forming a vertical stack of alternating first and second levels; the first levels comprising first material and the second levels comprising second material;
    forming an opening to extend through the stack, the opening having a peripheral sidewall;
    forming dielectric-barrier material adjacent the peripheral sidewall;
    forming charge-blocking material adjacent the dielectric-barrier material;
    forming charge-storage material adjacent the charge-blocking material;
    forming tunneling material adjacent the charge-storage material;
    forming channel material adjacent the tunneling material;
    removing the second material to leave first voids between the first levels;
    forming conductive levels within the first voids; the conductive levels having front ends with front surfaces; the front surfaces being along and directly against the dielectric-barrier material;
    removing the first material to leave second voids;
    lining the second voids with sacrificial material to narrow the second voids;
    extending the narrowed second voids through the dielectric-barrier material, the charge-blocking material and the charge-storage material; and
    removing the sacrificial material.

11. The method of claim 10 further comprising forming a liner material along the peripheral sidewall, and wherein the dielectric-barrier material is formed along the liner material.

12. The method of claim 11 wherein the liner material comprises metal.

13. The method of claim 12 wherein said metal comprises one or both of tungsten and ruthenium.

14. The method of claim 11 wherein the liner material comprises carbon.

15. The method of claim 14 wherein the liner material comprises the carbon in combination with one or more of silicon, oxygen and nitrogen.

16. The method of claim 15 wherein the liner material comprises SiOC, where the chemical formula indicates primary constituents rather than a specific stoichiometry; and wherein the carbon is present to a concentration within a range of from about 4 at % to about 20 at %.

17. The method of claim 15 wherein the liner material comprises SiC, where the chemical formula indicates primary constituents rather than a specific stoichiometry; and wherein the carbon is present to a concentration within a range of from about 4 at % to about 20 at %.

18. The method of claim 15 wherein the liner material comprises SiCN, where the chemical formula indicates primary constituents rather than a specific stoichiometry; and wherein the carbon is present to a concentration within a range of from about 1 ppm to about 5 at %.

* * * * *